United States Patent
Peer et al.

(10) Patent No.: US 9,754,901 B1
(45) Date of Patent: Sep. 5, 2017

(54) BULK THINNING DETECTOR

(71) Applicant: Cisco Technology, Inc., San Jose, CA (US)

(72) Inventors: Elad Peer, Yokneam Ilit (IL); Rami Sudai, Haifa (IL); Elena Sidorov, Haifa (IL)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 15/356,691

(22) Filed: Nov. 21, 2016

(51) Int. Cl.
- *H01L 23/58* (2006.01)
- *H01L 23/00* (2006.01)
- *H01L 23/528* (2006.01)

(52) U.S. Cl.
CPC .......... *H01L 23/573* (2013.01); *H01L 23/528* (2013.01)

(58) Field of Classification Search
CPC ......... H01L 21/76877; H01L 21/76879; H01L 21/76898; H01L 2224/03; H01L 21/173
See application file for complete search history.

(56) References Cited

U.S. PATENT DOCUMENTS

| | | | |
|---|---|---|---|
| 4,782,028 A * | 11/1988 | Farrier | H01L 27/14875 257/435 |
| 6,233,339 B1 | 5/2001 | Kawano et al. | |
| 7,409,876 B2 | 8/2008 | Ganapathi et al. | |
| 7,884,625 B2 | 2/2011 | Bartley et al. | |
| 7,952,478 B2 | 5/2011 | Bartley et al. | |
| 7,966,666 B2 | 6/2011 | Walker et al. | |
| 7,989,918 B2 | 8/2011 | Bartley et al. | |
| 8,330,191 B2 | 12/2012 | Hoofman et al. | |
| 8,415,607 B2 * | 4/2013 | Duerksen | G01J 1/4257 250/208.2 |
| 8,618,821 B2 | 12/2013 | Fornara et al. | |
| 8,938,627 B2 | 1/2015 | Oggioni et al. | |
| 9,076,699 B2 | 7/2015 | Zhang et al. | |
| 9,342,710 B2 | 5/2016 | Tiemeijer | |
| 2004/0207836 A1 * | 10/2004 | Chhibber | G01N 21/4738 356/237.4 |
| 2008/0251905 A1 | 10/2008 | Pope et al. | |
| 2013/0235544 A1 | 9/2013 | Tucker | |
| 2015/0214163 A1 | 7/2015 | Kuenemund et al. | |
| 2016/0133582 A1 | 5/2016 | Marinet et al. | |

OTHER PUBLICATIONS

Jung, Moongon et al.; A Study of TSV Variation Impact on Power Supply Noise, 978-1-4577-0502-1/11 copyright 2011 IEEE.

* cited by examiner

*Primary Examiner* — S. V. Clark
(74) *Attorney, Agent, or Firm* — Samuel M. Katz

(57) ABSTRACT

In one embodiment, a semiconductor device comprises: a bulk comprising a bulk material characterized by a potential designated as a ground, and a bulk thinning detector being a section of the bulk that includes one or more conducting materials. The bulk thinning detector is adapted to be connected to the ground when a part of the bulk material is underneath and contiguous with a portion of the one or more conducting materials in the section. The semiconductor device further comprises: one more electronic components in at least one active layer of the semiconductor device, the one or more electronic components and the bulk thinning detector being included in a circuit for detecting whether there is backside thinning of the semiconductor device by detecting whether at least one of: the bulk thinning detector is disconnected from the ground, or there is a change in resistance of the bulk thinning detector.

20 Claims, 15 Drawing Sheets

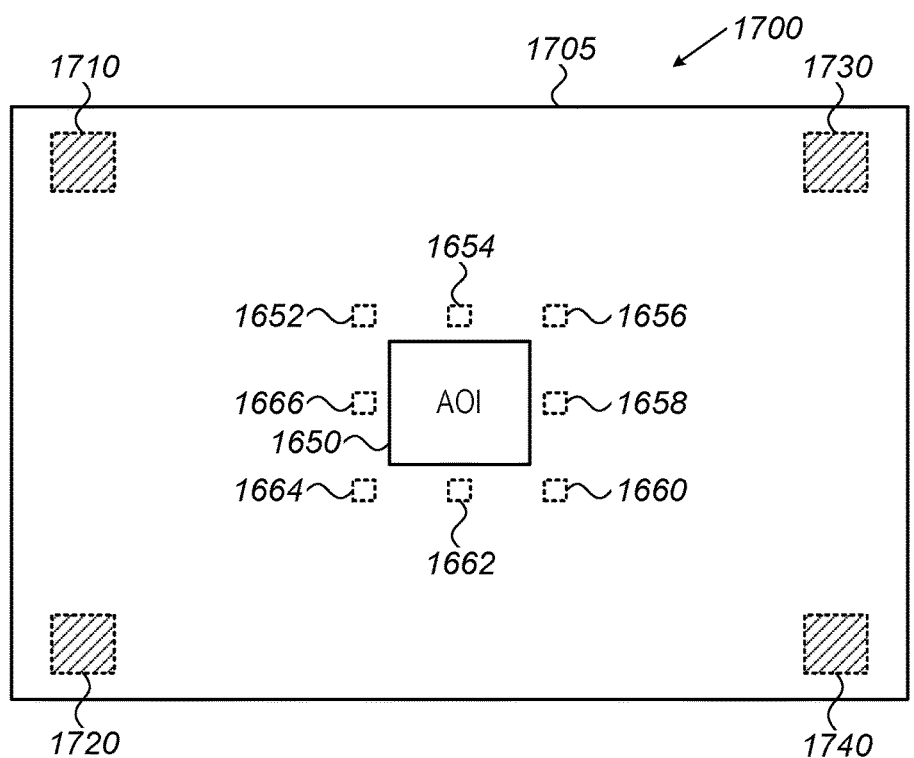
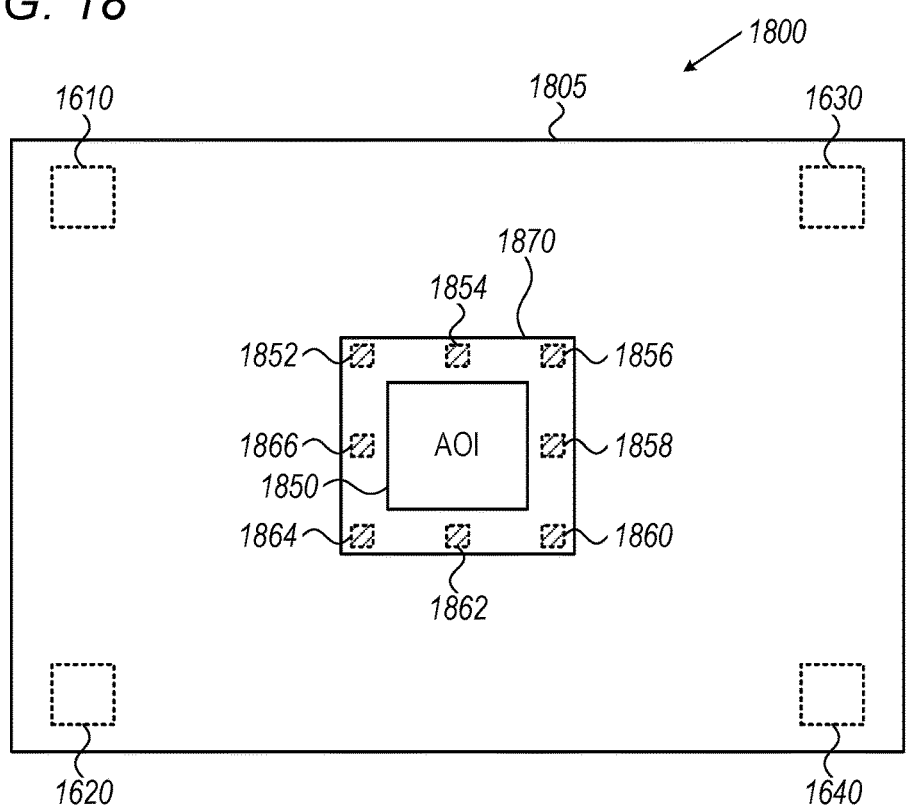
FIG. 17
FIG. 18

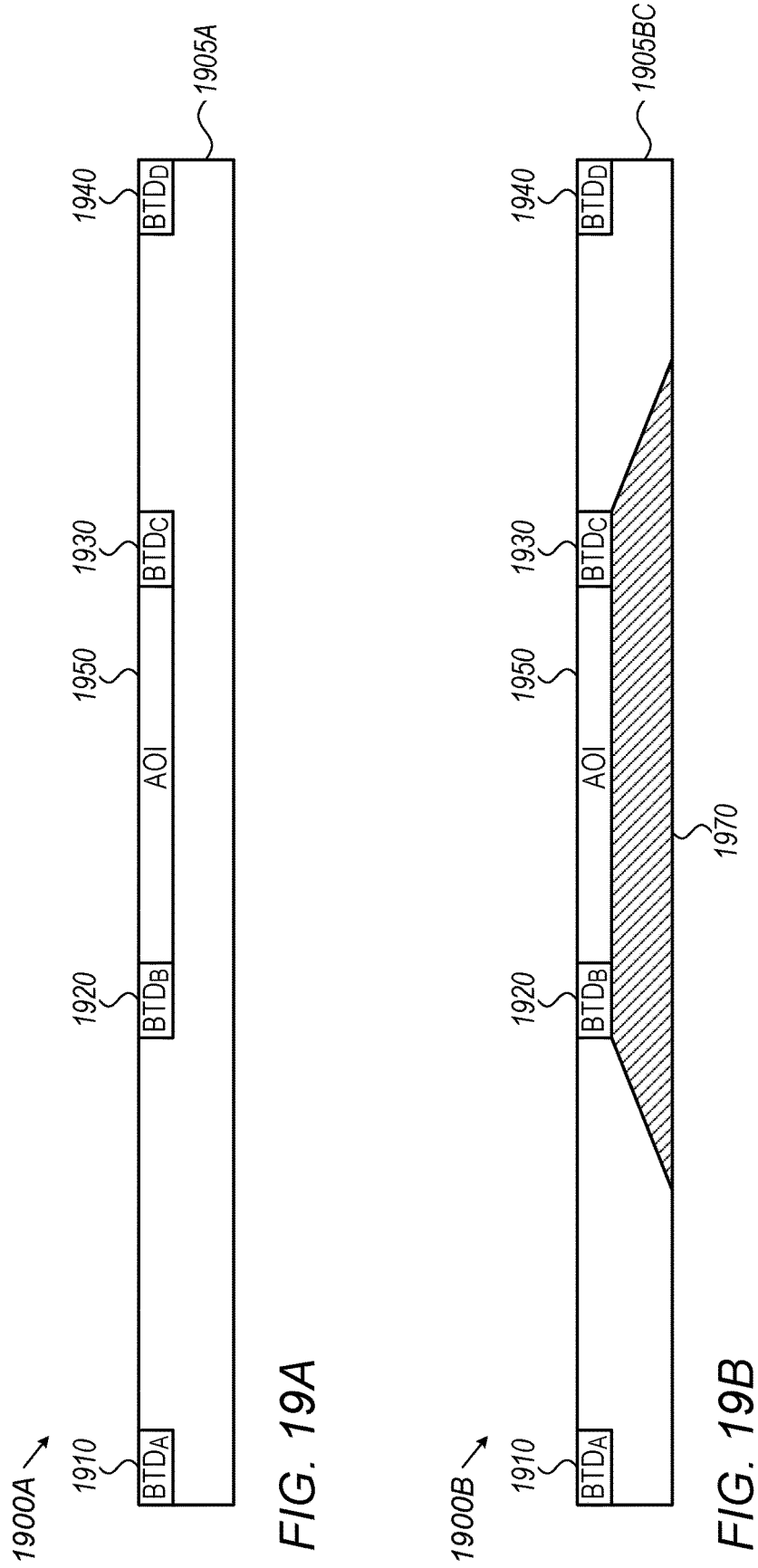

US 9,754,901 B1

BULK THINNING DETECTOR

TECHNICAL FIELD

The present disclosure generally relates to protection of semiconductor devices.

BACKGROUND

Physical techniques used for attacking and reverse engineering modern semiconductor devices may include device thinning as part of sample preparation. In many cases, the device may be thinned at the backside (i.e. the bottom) of the device, rather than the top, during reverse engineering and security attacks. For instance, it may be necessary to thin the device in order to enable optical attack techniques. Referring as an example to a device that includes embedded logic, memory and so forth, an optical attack may be capable of changing the state of a logic cell, reading logic states, or increasing the current consumption of the logic cell dependent on the state thereof, so that the increase in current consumption may be measured in order to determine the logic cell state. Thinning may also be referred to as de-processing. An example of de-processing may be layer by layer de-processing for reverse engineering or other attacks. De-processing may be a process used to understand the structure of the device, by removing layers and imaging them, then re-building the device structural and connection and logical schemes. Additionally or alternatively, de-processing may be used as a preparation stage for device editing and other attacks.

BRIEF DESCRIPTION OF THE DRAWINGS

The present disclosure will be understood and appreciated more fully from the following detailed description, taken in conjunction with the drawings in which:

FIGS. 16, 17 and 18 illustrate examples of top views of a bulk that includes a plurality of bulk thinning detectors, in accordance with some embodiments of the presently disclosed subject matter;

FIGS. 19A and 19B illustrate other examples of front views of a cross section of a bulk that includes a plurality of bulk thinning detectors, in accordance with some embodiments of the presently disclosed subject matter;

DESCRIPTION OF EXAMPLE EMBODIMENTS

Overview

Figure 1:
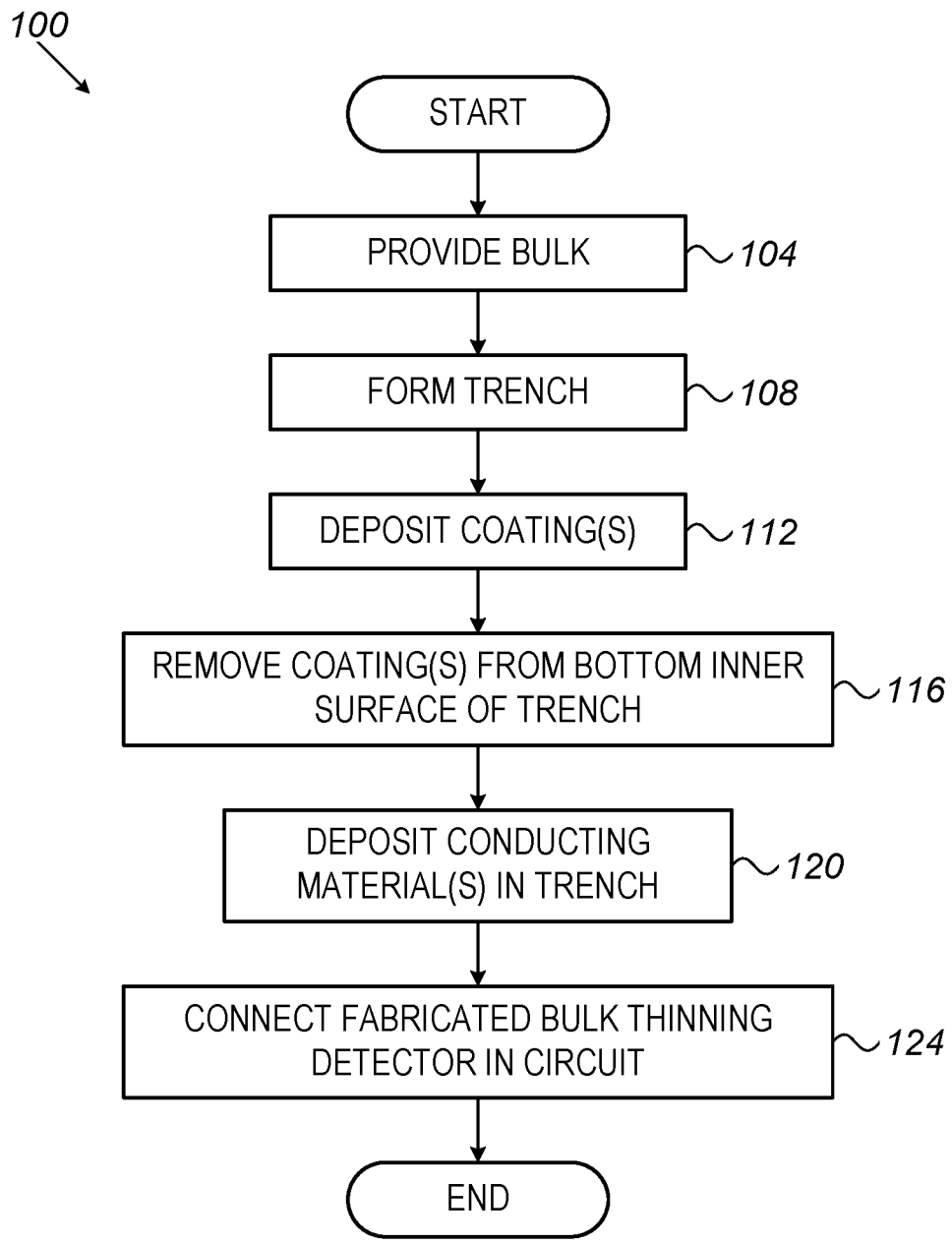
FIG. 1 is a flowchart of a method, in accordance with some embodiments of the presently disclosed subject matter.

There is provided, in accordance with some embodiments of the presently disclosed subject matter, a semiconductor device comprising: a bulk, the bulk comprising a bulk material characterized by a potential designated as a ground for the semiconductor device, the bulk further comprising a bulk thinning detector being a section of the bulk that includes one or more electrical conducting materials, wherein the bulk thinning detector is adapted to be connected to the ground when a part of the bulk material is underneath and contiguous with a portion of the one or more electrical conducting materials in the section. In such embodiments, the semiconductor device further comprises: one more electronic components in at least one active layer of the semiconductor device, the one or more electronic components and the bulk thinning detector being included in a circuit for detecting whether there is backside thinning of the semiconductor device, the circuit being adapted to detect whether there is backside thinning by detecting whether at least one of: the bulk thinning detector is disconnected from the ground, or there is a change in resistance of the bulk thinning detector.

EXAMPLE EMBODIMENTS

A semiconductor device (also referred to as "device") may include at least: active layer(s), interconnect layer(s), and bulk layer(s) (referred to herein for simplicity's sake as "bulk"). The bulk will now be described, while more details relating to various possible other layers of the semiconductor devices are provided towards the end of the description.

Typically although not necessarily, the bulk may be below the active layer(s). The bulk may in some embodiments include at least one of the material(s) used in the active layer(s). For simplicity's sake, one of the material(s) that is included in the bulk is termed herein "the bulk material". The bulk material is a material whose potential is designated as ground (i.e. as being the ground potential) for the semiconductor device. Typically although not necessarily, the bulk material may be a semiconductor material that is the primary material used in the active layer(s). For example, the bulk material may be silicon. In some cases, one or more wafers, or in other words thin slice(s) of semiconductor material, such as single-crystal silicon, may be used, at least for the bulk and/or active layer(s).

The main role of the bulk is to provide mechanical support and therefore any layer whose main role is to provide mechanical support may be considered to be bulk. The bulk may also provide thermal dispersion. However, in accordance with embodiments of the presently disclosed subject matter, the bulk may also have an electrical role, as will now be described in more detail.

In order to provide an electrical role, the bulk may include one or more bulk thinning detectors. The bulk thinning detectors may be one or more sections of the bulk, each section including one or more electrical conducting materials (also referred to as "conducting material(s)"). If there are two or more sections, then any two different sections may include the same conducting material(s) or different conducting material(s). Examples of a conducting material that may be used may include: copper, tungsten, and polysilicon.

Resistivity of a conducting material may be a property of the conducting material. The resistance of a bulk thinning detector, or in other words of the section of the bulk that includes conducting material(s), may be dependent on the resistivity/ies of the conducting material(s) in the section and on the respective geometry/ies of the conducting material(s) in the section. Therefore, if the geometry/ies and the resistivity/ies of the conducting material(s) in the section are known, the resistance of the bulk thinning detector may be determined.

For simplicity's sake, it is assumed in the description of some of the embodiments described below, that a particular section may include only one conducting material and that the geometry of the conducting material is the same as the geometry of the section, even though it is possible in such embodiments that the section may include other material(s), e.g. material(s) for preventing diffusion of the conducting material outside the section. Therefore, in such embodiments, if the geometry of the section and the resistivity of the conducting material in the section are known, the resistance of the bulk thinning detector may be determined. For example, the resistance may equal the resistivity "ρ" of the conducting material multiplied by the height (or in other words, depth or length "l") of the section and divided by the cross-sectional area of the section. Assuming, for the sake of example, a section that is cylindrical, the resistance may equal $$\frac{\rho * l}{\text{cross section area}} = \frac{\rho * l}{\pi r^2},$$

where r is the radius of the cross-sectional area. Further for the sake of the example copper may be assumed to be the conducting material, having a resistivity of 16.8 nΩ·m at 20° C. Further, assuming for the sake of the example a cross-sectional area of 1 micron and a length of 150 microns, the resistance of the bulk thinning detector may equal approximately 2.52Ω. If the length were instead 200 microns, the resistance of the bulk thinning detector may instead equal approximately 3.36Ω. Possible lengths, cross-sectional areas, resistivities and resistances are not bound by the particular examples above, and may differ from the values noted above depending on the embodiment.

It is noted that the boundaries of conducting material(s) included in a section may be affected by the boundaries of the section and vice versa. If conducting material(s) is moved and/or is removed or added, the boundaries of the section may consequently also move and/or shrink or expand. Therefore, the geometry of the section and of the conducting material(s) may change during the lifetime of the device, e.g. due to backside thinning. It is also noted that although the examples of length and cross-sectional area were given above, the term "geometry" is not limited to such examples and therefore a change in geometry which leads to a change in resistance may not necessarily be a result of a change in length and/or cross-sectional area.

A bulk thinning detector (that is a bulk section including conducting material(s)) may be adapted to be connected to the ground when a portion of the conducting material(s) in the section is contiguous with a part of the bulk material (and therefore, there may be electrical contact between the portion and the part). In order to enable detection of thinning of the backside of the device, the portion may be designed to be at the bottom of the section. The portion may therefore be contiguous with part of the bulk material provided that there is bulk material that is underneath and contiguous to the portion, which should be the case as long as not all the bulk material below the portion has been removed by backside thinning. Such a bulk thinning detector may be adapted to be connected to the ground when a part of the bulk material is underneath and contiguous with a portion of the conducting material(s). Such a bulk thinning detector may be further adapted to be disconnected from the ground, by backside thinning which removes the part of the bulk underneath and contiguous with the portion of the conducting material(s), and/or may be adapted to have resistance thereof lowered by backside thinning which removes at least some of the conducting material(s).

A circuit that includes a bulk thinning detector (the bulk thinning detector being a bulk section that includes conducting material(s)) may be adapted to operate when supplied with power (e.g. from a power source internal or external to the semiconductor device with the circuit) and detect at least one of: the bulk thinning detector is connected to the ground (e.g. which may occur when a part of the bulk material is underneath and contiguous with a portion of the conducting material(s) in the bulk section); the bulk thinning detector is disconnected from the ground (e.g. which may occur when no bulk material is underneath and contiguous with any of the one or more conducting material(s) in the bulk section); that the resistance of the bulk thinning detector is unchanged (e.g. which may occur when the geometry of conducting material(s) is unaltered); or that the resistance of the bulk thinning detector is changed (e.g. which may occur when there is a change in geometry of the conducting material(s)). Therefore, by detecting whether the bulk thinning detector is disconnected from ground and/or whether there is a change in resistance of the bulk thinning detector, such a circuit may detect whether there is backside thinning of a semiconductor device that includes the circuit.

It is possible that in some cases, before or while backside thinning of a semiconductor device takes place (e.g. by an attacker), the semiconductor device may be disconnected (e.g. by an attacker) from a power source. For instance, the disconnected power source may be external to the semiconductor device. If disconnection of the semiconductor device from a power source has taken place, a circuit (included in the semiconductor device) for detecting whether there is backside thinning of the semiconductor device may not operate during any or all of the backside thinning. Consequently the circuit may not detect during the backside thinning if the backside thinning causes a bulk thinning detector (included in the circuit) to be disconnected from the ground, where the bulk thinning detector may be a bulk section including conducting material(s), and disconnection from the ground may be due to the backside thinning removing the part of the bulk material that was underneath and contiguous with a portion of the conducting material(s) in the bulk section. Additionally or alternatively, the circuit may not detect during the backside thinning if the backside thinning causes the resistance of a bulk thinning detector to change, where the change in resistance may be due to the backside thinning moving and/or removing some of the conducting material(s), and therefore changing the geometry of the conducting material(s). For instance, removal of at least some conducting material(s) may cause the resistance to be lowered.

In such cases, if the backside thinning causes the bulk thinning detector to be disconnected from the ground, it may or may not be possible that the bulk thinning detector may be reconnected to the ground (e.g. by an attacker), before the semiconductor device is connected (e.g. by an attacker) to a (same or different) power source. For example, the attacker may reconnect the bulk thinning detector to the ground by providing a connection between the conducting material(s) and the bulk material, or between the conducting material(s) and another ground (e.g. external to the semiconductor device), before connecting the semiconductor device to the (same or different) power source. If reconnection to the ground occurs, then during reconnection to the ground, the geometry of the conducting material(s) and consequently the resistance of the bulk thinning detector may or may not change, e.g. depending on whether or not some more conducting material(s) is added or some of the conducting material(s) is moved when making the reconnection to the ground. If there is a change in resistance, the circuit may not detect the change while the change is occurring. (It is noted that the statement that the bulk thinning detector is adapted to be connected to the ground when a part of the bulk material is underneath and contiguous with a portion of the conducting material(s) in the section, is not meant to preclude the possibility of the bulk thinning detector being connected to the ground when no bulk material is underneath and contiguous with any of the conducting material(s) in the section, as may be seen from the example given here of optional reconnection to the ground). In such cases where the semiconductor device was disconnected from the power source, once the circuit is resupplied with power and may operate, the circuit may detect whether the bulk thinning detector is disconnected from the ground and/or whether resistance of the bulk thinning detector is changed.

In some embodiments, a semiconductor device may include circuit(s) for detecting whether there is backside thinning, the circuit(s) including a certain bulk thinning detector. In some of such embodiments, one or more other bulk thinning detectors may be included in the same circuit (s) as the certain bulk thinning detector and/or may be included in one or more circuit(s) for detecting whether there is backside thinning that do not include the certain bulk thinning detector. It is noted that detection of backside thinning does not necessarily imply that the entire backside was thinned evenly. As will be discussed in more detail below, if the bulk of a semiconductor device includes a plurality of bulk thinning detectors that are connected in circuit(s) for detecting whether there is backside thinning, rather than a single bulk thinning detector, the circuit(s) may be more likely to detect backside thinning and/or the circuit (s) may be adapted to detect location of thinning and/or amount of thinning by detecting which, if any, of the bulk thinning detectors is disconnected from the ground or has a changed resistance.

Circuit(s) discussed herein may include, besides bulk thinning detector(s), one or more electronic component(s) in the active layer(s) of the semiconductor device. Connections in the interconnect layer(s) of the semiconductor device may connect among the bulk thinning detector(s) and the component(s) in the active layer(s).

As may be understood from the discussion above, the resistance of a bulk thinning detector may be dependent on the resistivity/ies and geometry/ies of the conducting material(s) in the section corresponding to the bulk detector. The resistance of the bulk thinning detector may therefore be taken into account when designing circuit(s) to detect whether there is backside thinning of the semiconductor device by detecting whether the bulk thinning detector characterized by the resistance is disconnected from the ground, and/or whether the resistance has changed. Therefore resistivity/ies and geometry/ies may vary depending on the embodiment, as circuit(s) may be designed to accommodate various resistivity/ies and geometry/ies.

A method of fabricating a bulk thinning detector will now be described. Beforehand, however, technology for fabricating a through silicon via ("TSV") will be summarized so that the differences between a bulk thinning detector and a TSV will be better understood by the reader.

As is known in the art, when a specific die is stacked on top of another die (e.g. in a three dimensional package), a through silicon via may be fabricated in a bulk of the specific die in order to provide a connection between the specific die and the other die that is below the specific die. Therefore, when fabricating a through silicon via in the bulk of the specific die, the bulk of the specific die may be mechanically polished from the backside in order to expose conducting material on the bottom of the through silicon via. For example, if the through silicon via extends e.g. approximately 400 µm deep from the top of the bulk of the specific die, the backside of the specific die may be polished so that the bottom of the bulk of the specific die is at approximately 400 µm from the top of the bulk of the specific die, and therefore the conducting material is exposed.

FIG. 1 is a flowchart of a method 100, in accordance with some embodiments of the presently disclosed subject matter. Method 100 may include stages for fabricating a bulk thinning detector that is connected to the ground (e.g. stages 108 to 120). Fabrication of a bulk thinning detector may use some of the technology developed for fabricating a through silicon via ("TSV") in a bulk. In the description of method 100, the particular stages which differ from the technique of fabricating a through silicon via will be elaborated on more than the other stages. For simplicity's sake method 100 will be mostly described with reference to a single bulk thinning detector, but in some embodiments, a plurality of bulk thinning detectors may be fabricated in a bulk in a similar fashion, mutatis mutandis.

In stage 104, a semiconductor device may be provided, including a bulk. The bulk may comprise a bulk material characterized by a potential designated as ground for the semiconductor device. The provided semiconductor device may also include fabricated active layer(s) that include fabricated electronic component(s), e.g. electronic component(s) for circuit(s) that may detect backside thinning, electronic component(s) for performing one or more functions, etc.

In stage 108 a trench may be formed from a top of the bulk to a depth or range of depths that is less than a depth of the bulk. The trench may be formed by removing a part of the bulk material, using any appropriate technique(s).

For example, stage 108 may include lithography where photoresist may be applied on a top surface of the bulk. A mask may be designed which allows light where the trench is to be located. The top surface of the bulk may be exposed to light through the mask, thereby removing the photoresist where the trench is to be located.

Figure 2:
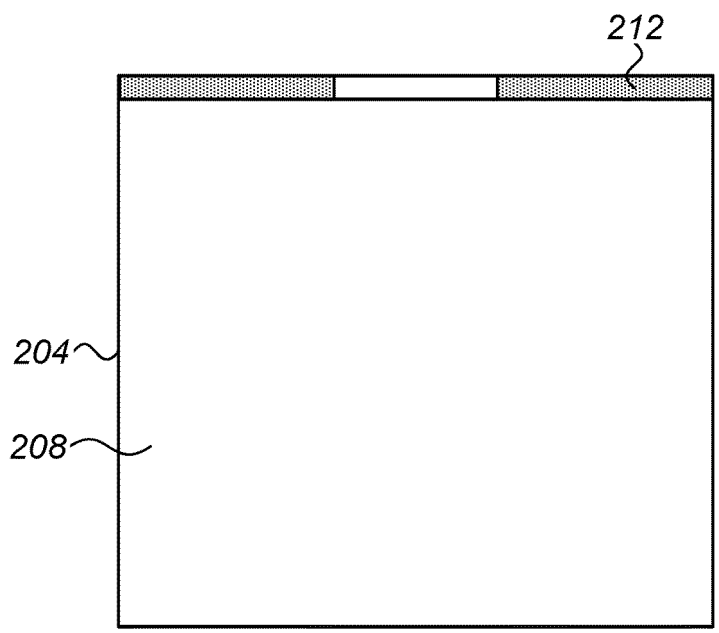
FIG. 2 illustrates a bulk including bulk material, in accordance with some embodiments of the presently disclosed subject matter.

Refer to FIG. 2 which illustrates a bulk 204 including bulk material 208, in accordance with some embodiments of the presently disclosed subject matter. Most of the top surface of bulk 204 has photoresist 212 still on the top surface. The part of the top surface without the photoresist is where the trench is to be located.

It is noted that FIG. 2 and the following figures used to illustrate the fabrication of the bulk thinning detector do not show other layer(s) of the semiconductor device (besides bulk 204), so as to not complicate the figures.

Stage 108 may also include, for example, etching the bulk where no photoresist remains on the top surface. The etching may include a high aspect ratio reactive ion etching. For instance, if the bulk material is silicon, sulfur hexafluoride ($SF_6$) may be used.

Figure 3:
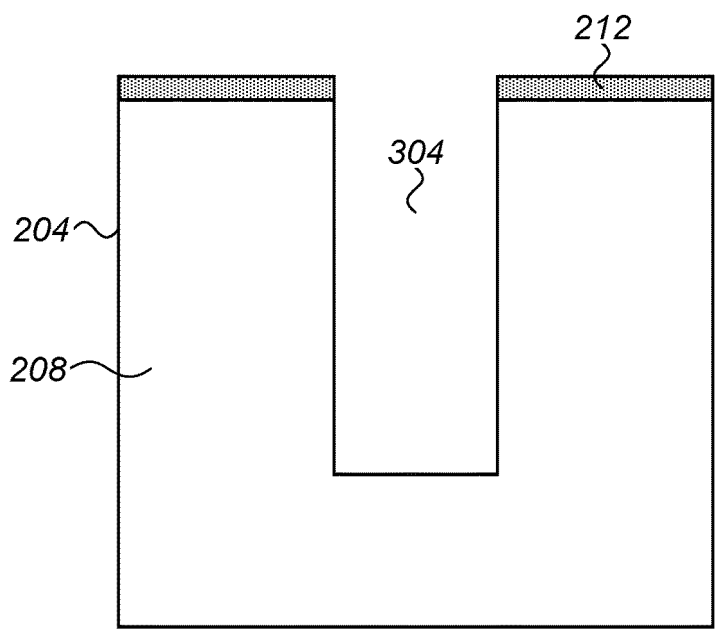
FIG. 3 illustrates a trench in a bulk, in accordance with some embodiments of the presently disclosed subject matter.

Refer to FIG. 3 which illustrates a trench 304 in bulk 204, in accordance with some embodiments of the presently disclosed subject matter. As illustrated in FIG. 3, the etching resulted in trench 304 that is shown in bulk 204.

The etching in stage 108 may be implemented using the Bosch process and/or any other appropriate process.

In some embodiments where a plurality of trenches are to be etched, an iterative procedure may be required for stage 108. For example, it may be assumed that there will be four trenches, the deepest trench approximately 200 microns deep, the next two deepest approximately 150 microns deep, and the shallowest approximately 100 microns deep. (For simplicity's sake, although not limiting, it is assumed that each trench corresponds to a single depth rather than a range of depths). A mask may be designed so that first the deepest trench may be etched, by removing an amount of bulk material having a depth approximately equal to the difference in depth between the desired depth of the deepest trench and the desired depth of the next two deepest trenches (e.g. approximately 50 microns which equals the difference between approximately 200 microns and approximately 150 microns). Then a mask may be designed so that the deepest trench and the next two deepest trenches may be etched by the difference between the next two deepest trenches and the shallowest trench (e.g. approximately 50 microns which equals the difference between approximately 150 microns and approximately 100 microns).

Finally, a mask may be designed so that all of the trenches may be etched by the depth of the shallowest trench (e.g. approximately 100 microns). Similarly, regardless of whether single depths or ranges of depths correspond to the trenches, a mask may be designed for removing first an amount of bulk material having a depth equivalent to the difference between a (first) deepest depth and the (second) next deepest depth included among the depths or ranges of depths, then another mask for removing an amount of bulk material having a depth equivalent to the difference between the second deepest depth, and the third deepest depth (i.e. the depth that is next in size after the second deepest), etc.

It is noted that when forming conventional through silicon vias when stacking dies, there would be no reason to have through silicon vias of different depths as the backside would need to be thinned during fabrication to the shallowest via so as to expose the conducting material for all the vias. Stage 108 is not bound by any particular number of trench(es), depth(s), and/or process(es)/procedure(s) for forming trench(es), and any appropriate number of trench(es), depth(s), and/or process(es)/procedure(s) may be implemented in stage 108.

In stage 112, one or more materials may be deposited along inner surfaces of the trench.

For example, the one or more materials (also referred to as "coating(s)") may be characterized by low diffusivity with respect to one or more electrical conducting materials (to be deposited in the trench) and/or with respect to the bulk material.

For example, copper may be the conducting material that is selected to be deposited in the trench. Copper (Cu) may be used as a conducting material due to having a low resistivity (and therefore low resistance to electrical current) and being highly capable of resisting electro-migration. However, assuming the bulk material is silicon (Si), if copper comes into contact with the silicon, copper may contaminate the silicon and react to form $Cu_3Si$ at a low temperature (e.g. less than approximately 200 degrees Celsius). Therefore an effective diffusion barrier may be required to prevent copper contamination. Various materials may have low diffusivity with respect to copper, such as titanium tungsten (TiW). Various other materials may have low diffusivity with respect to silicon. For example, oxygen (and therefore a resulting oxide) may have low diffusivity with respect to silicon. It is noted that contamination of silicon that is closer to the top of the bulk may be more problematic, being closer to the active layer(s), than any possible contamination that may occur toward the bottom of the bulk.

Figure 4:
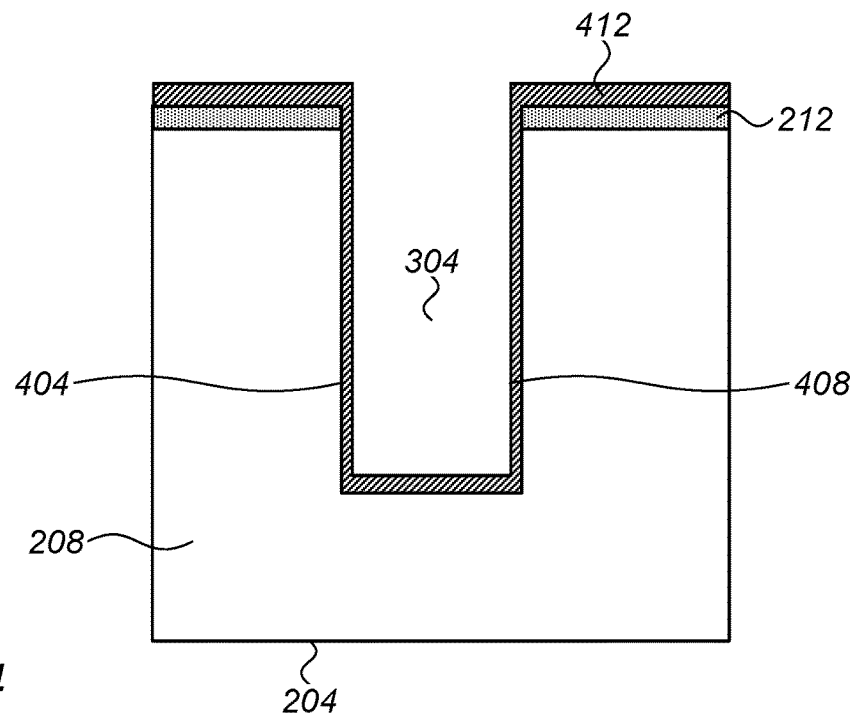
FIG. 4 illustrates a result of thermal oxide plasma enhanced chemical vapor deposition on a bulk, in accordance with some embodiments of the presently disclosed subject matter.

Refer to FIG. 4 which illustrates a result of thermal oxide plasma enhanced chemical vapor deposition (PECVD) on bulk 204, in accordance with some embodiments of the presently disclosed subject matter.

As shown in FIG. 4, thermal oxide deposition (also referred to as thermal oxidation) may produce an oxide coating 408 (e.g. silicon dioxide coating) on the inside surfaces 404 of trench 304. An oxide coating 412 (e.g. silicon dioxide coating) may also cover photoresist 212.

Oxide coating 408 may prevent diffusion of conducting material such as copper (when deposited) into bulk material 208 (e.g. prevent conducting material, that may have diffused via a barrier coating to be described next, from diffusing into bulk material 208).

Figure 5:
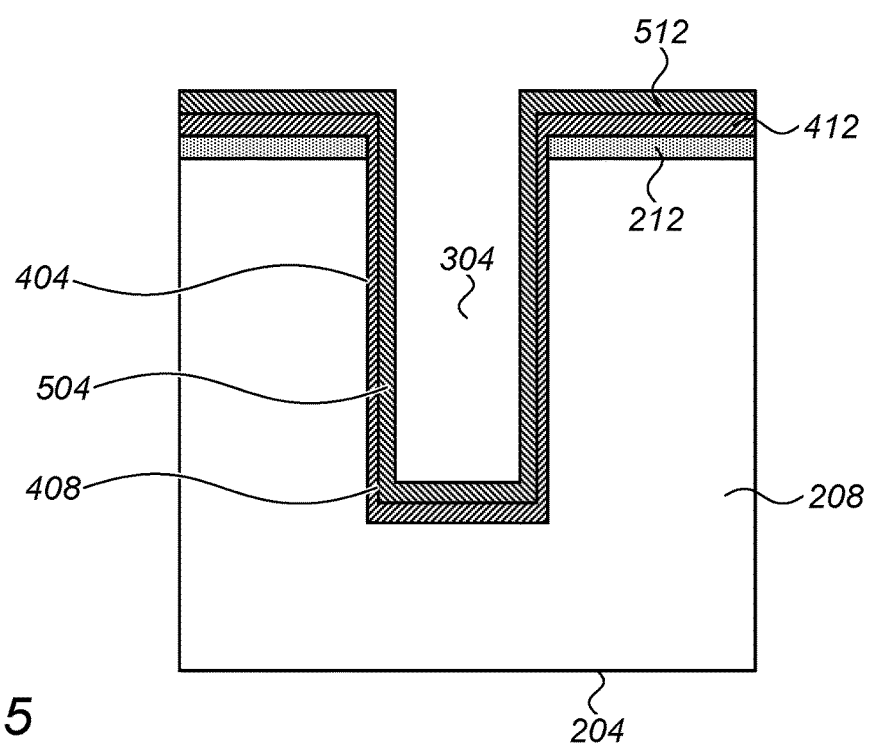
FIG. 5 illustrates a barrier coating deposited on a bulk, in accordance with some embodiments of the presently disclosed subject matter.

FIG. 5 illustrates a barrier coating deposited on bulk 204, in accordance with some embodiments of the presently disclosed subject matter.

As shown in FIG. 5, a barrier coating 504 such as titanium tungsten may be deposited on the inside surfaces 404 of trench 304, for example on top of oxide coating 408 (and therefore closer to the middle of trench 304). A barrier coating 512 such as titanium tungsten may also be deposited on top of oxide coating 412 covering photoresist 212.

Barrier coating 504 may prevent the diffusion of conducting material such as copper, once deposited, into bulk material 208. For example barrier coating 504 may prevent conducting material, once deposited, from diffusing into oxide coating 408, as the conducting material may potentially then diffuse into bulk material 208.

Referring again to FIG. 1 in stage 116, the coating(s) deposited in stage 112 on the bottom inner surface of the trench may be removed from the bottom inner surface of the trench.

For example, the coating(s) may be removed using anisotropic plasma etching, also referred to as orientation dependent etching, so that the etch rate is not the same in all directions. Stage 116 differs from the technique used to fabricate a TSV, because when fabricating a TSV the coating(s) would not be removed from the bottom of the trench prior to depositing the conducting material(s).

In order to remove titanium tungsten, a gas that may be used in the anisotropic plasma etching may comprise for example reactive ions of, say, fluorine or an oxyacid compound (e.g. oxygen combined with a halogen).

Figure 6:
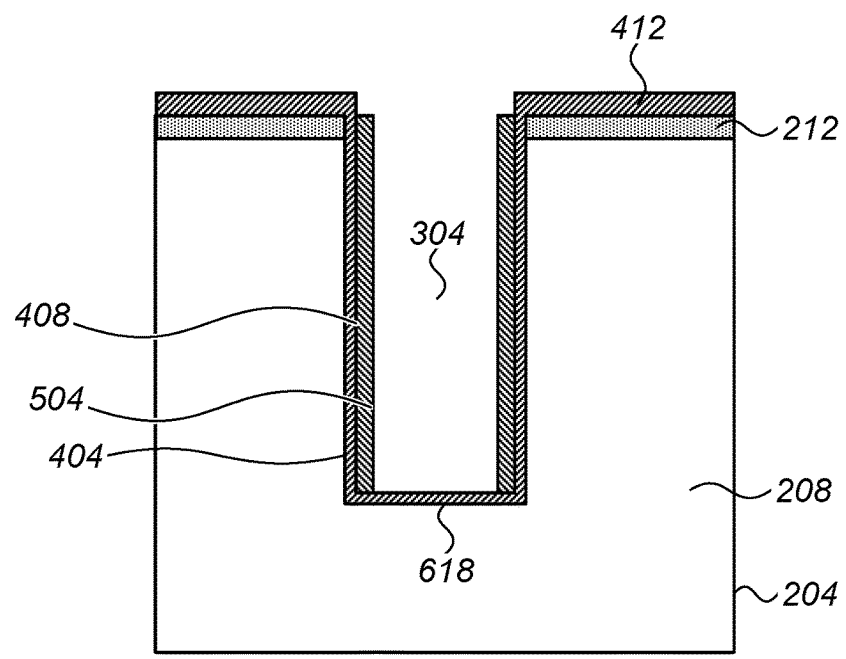
FIG. 6 illustrates a bulk after a barrier coating was removed from the bottom inner surface of a trench, in accordance with some embodiments of the presently disclosed subject matter.

Refer to FIG. 6, which illustrates bulk 204 after barrier coating 504 was removed from the bottom inner surface 618 of trench 304, in accordance with some embodiments of the presently disclosed subject matter.

For example, if the oxide coating is silicon dioxide then the gas that may be used in anisotropic plasma etching may comprise, for example, reactive ions of $C_4H_8$, $CHF_3$, or CF4. Examples of $C_4H_8$ may include butene, butylene, alpha-butylene, ethyletheylene, alpha-butene, n-butene, n-butylene, etc. Examples of $CHF_3$ may include Fluoroform. Examples of CF4 may include tetrafluoromethane, carbon tetrafluoride, etc.

Figure 7:
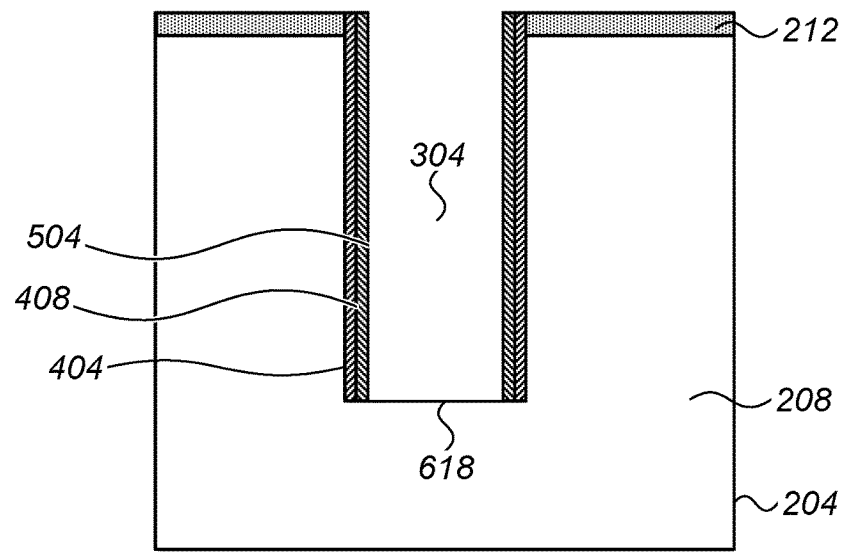
FIG. 7 illustrates a bulk after an oxide coating was removed from the bottom inner surface of a trench, in accordance with some embodiments of the presently disclosed subject matter.

Refer to FIG. 7 which illustrates bulk 204 after oxide coating 408 was removed from the bottom inner surface 618 of trench 304, in accordance with some embodiments of the presently disclosed subject matter.

Optionally, the remaining photoresist may also be removed so that conducting material may be deposited on the top surface of the bulk. For example, the photoresist may be removed with acetone.

Figure 8:
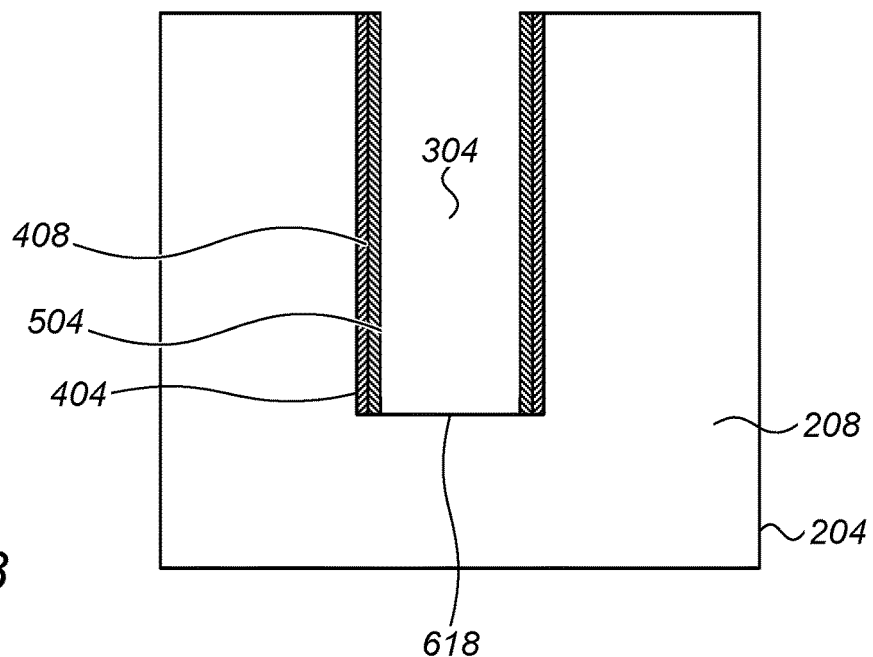
FIG. 8 illustrates a bulk with photoresist removed, in accordance with some embodiments of the presently disclosed subject matter.

FIG. 8 illustrates bulk 204 with photoresist removed, in accordance with some embodiments of the presently disclosed subject matter.

In stage 120 of FIG. 1, conducting material(s) may be deposited in the trench. A portion of the conducting material(s) may be contiguous with a part of the bulk material that is underneath the trench, due to the removal in stage 116 of the coatings from the bottom of the trench.

Once conducting material(s) have/has been deposited in the trench, the trench with conducting materials may also be referred to herein as the section that includes conducting material(s), discussed above. Examples of conducting material(s) that may be deposited may include copper, tungsten, polysilicon, etc.

Although deposit of conducting material in a trench may also be performed when forming a through silicon via, in the case of a through silicon via, the bottom of the trench would still be coated with coating(s) such as silicon dioxide and/or titanium tungsten, and so deposited conducting material would not be contiguous with bulk material.

Figure 9:
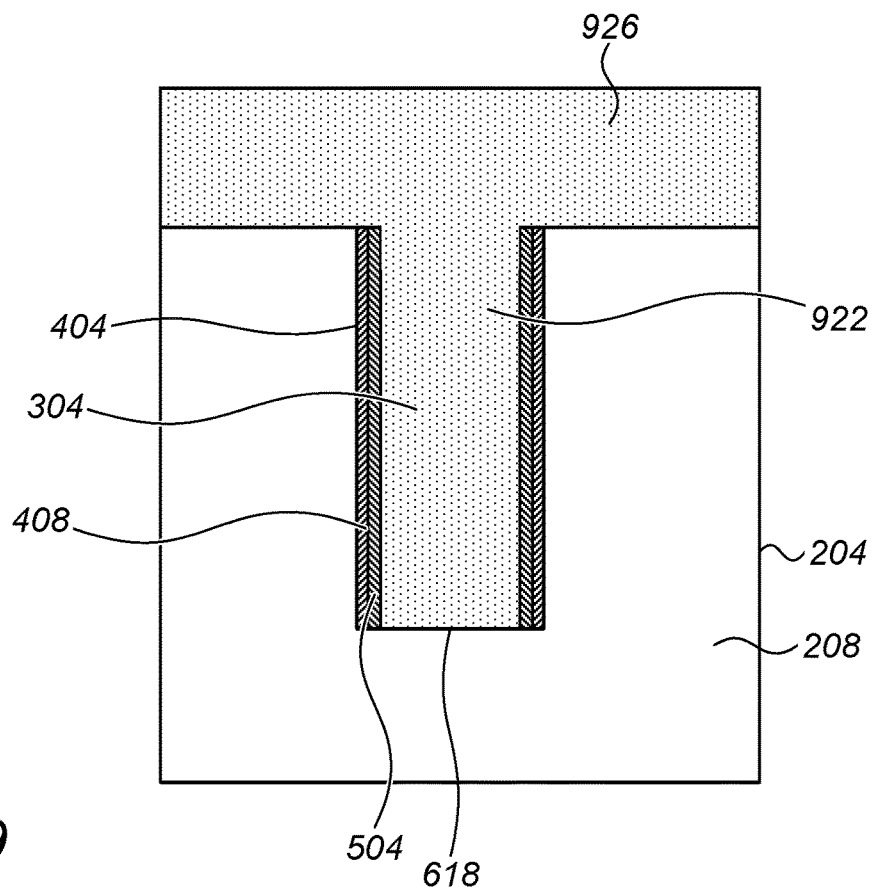
FIG. 9 illustrates a bulk with copper deposited in a trench, in accordance with some embodiments of the presently disclosed subject matter.

FIG. 9 illustrates bulk 204 with copper 922 deposited in trench 304, in accordance with some embodiments of the presently disclosed subject matter.

In some cases (as shown in FIG. 9), a layer of copper 926 may also be deposited on the top surface of bulk 204. In such cases, the layer of copper 926 may later be removed by chemical and/or mechanical polishing.

Figure 10:
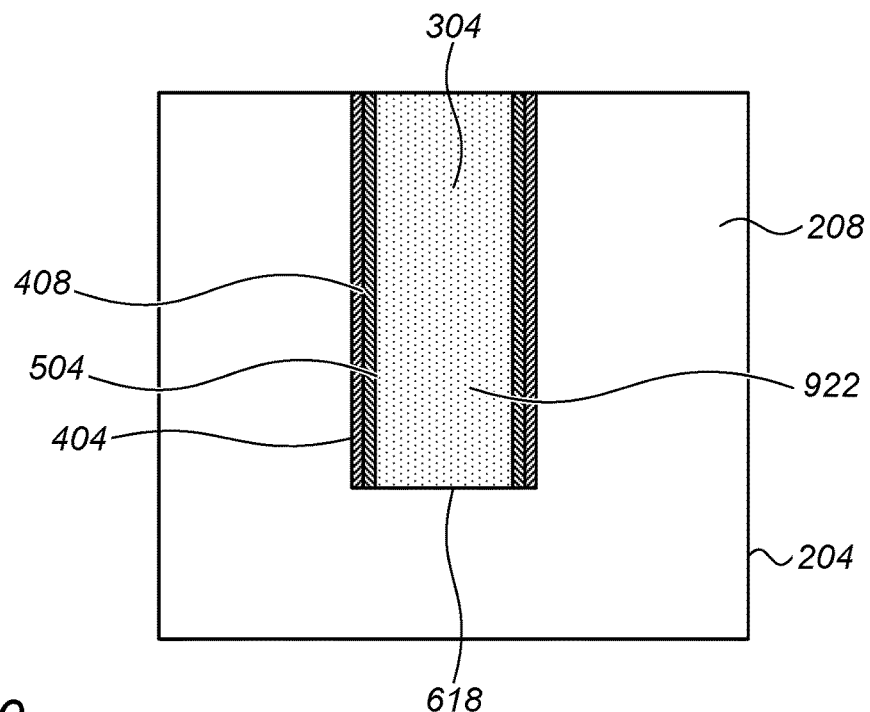
FIG. 10 illustrates a bulk after a layer of copper has been removed by polishing, in accordance with some embodiments of the presently disclosed subject matter.

FIG. 10 illustrates bulk 204 after the layer of copper 926 has been removed by polishing, in accordance with some embodiments of the presently disclosed subject matter.

In stage 124, the bulk thinning detector connected to the ground, e.g. fabricated in accordance with stages 108 to 120 of method 100, may be connected in a circuit for detecting whether there is backside thinning of the semiconductor device. For instance, the circuit may be adapted to detect whether there is backside thinning by detecting whether at least one of: the bulk thinning detector is disconnected from the ground, or there is a change in resistance of the bulk thinning detector.

For example, the bulk thinning detector may be connected in the circuit by providing a connection between at least some deposited conducting material(s) and one or more other electronic components (e.g. in active layer(s) of the semiconductor device) in the circuit. Optionally the bulk thinning detector may be connected in a plurality of (independent) circuits for detecting whether there is backside thinning.

Figure 11:
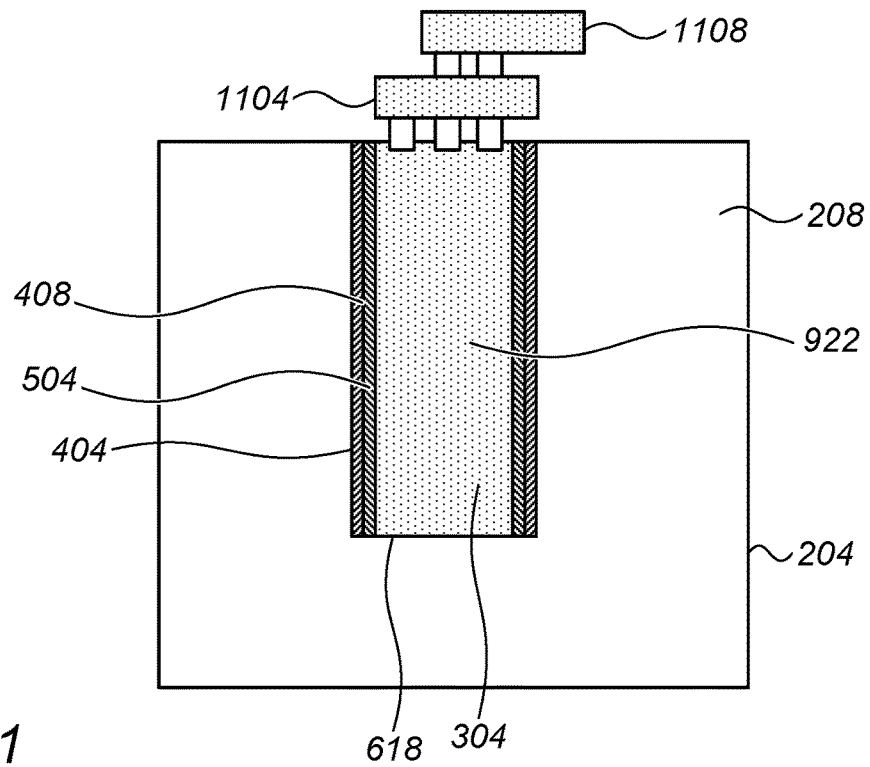
FIG. 11 illustrates two interconnect layers connected to deposited copper at the top of a trench, in accordance with some embodiments of the presently disclosed subject matter.

Refer to FIG. 11 which illustrates two interconnect layers 1104 and 1108 connected to deposited copper 922 at the top of the trench 304, in accordance with some embodiments of the presently disclosed subject matter.

For example, interconnect layer 1104 and/or interconnect layer 1108 may provide connection(s) between deposited copper 922 at the top of the trench 304 and one or more other circuit electronic components (e.g. in active layer(s)), and thereby the bulk thinning detector may be connected to one or more other electronic components in the circuit. Interconnect layer(s) 1104 and/or 1108 may be fabricated after fabrication of the bulk thinning detector(s) and the active layer(s).

The method in accordance with embodiments of the presently disclosed subject matter is not limited by the stages described herein with reference to FIG. 1. For example, in some embodiments, stage(s) shown in FIG. 1 may be performed in a different order in the method than illustrated, and/or two or more stages that are shown as being sequentially performed may instead be performed simultaneously in the method. Additionally or alternatively, in some embodiments, the method may include fewer, more and/or different stages than illustrated in FIG. 1.

Furthermore, the shape of a section that includes the conducting material(s) is not bound by the trench shown in FIGS. 2 to 11, nor by other examples described herein. For example, the shape of a section may not necessarily be 3-dimensional rectangular, nor necessarily cylindrical, nor necessarily any particular shape, but may be any appropriate shape. As another example, the shape of the section may be symmetrical or asymmetrical. Continuing with the example, a perimeter of a particular section, for instance, may not necessarily include parallel vertical lines extending to the same depth into the bulk. Therefore the entire bottom of a section may not necessarily be at the same depth from the top of the bulk. In cases where the entire bottom of a section may not be at the same depth from the top of the bulk, the section may be considered to have a range of depths rather than a single depth.

Some examples of circuits which may include a bulk thinning detector will now be described.

Figure 12:
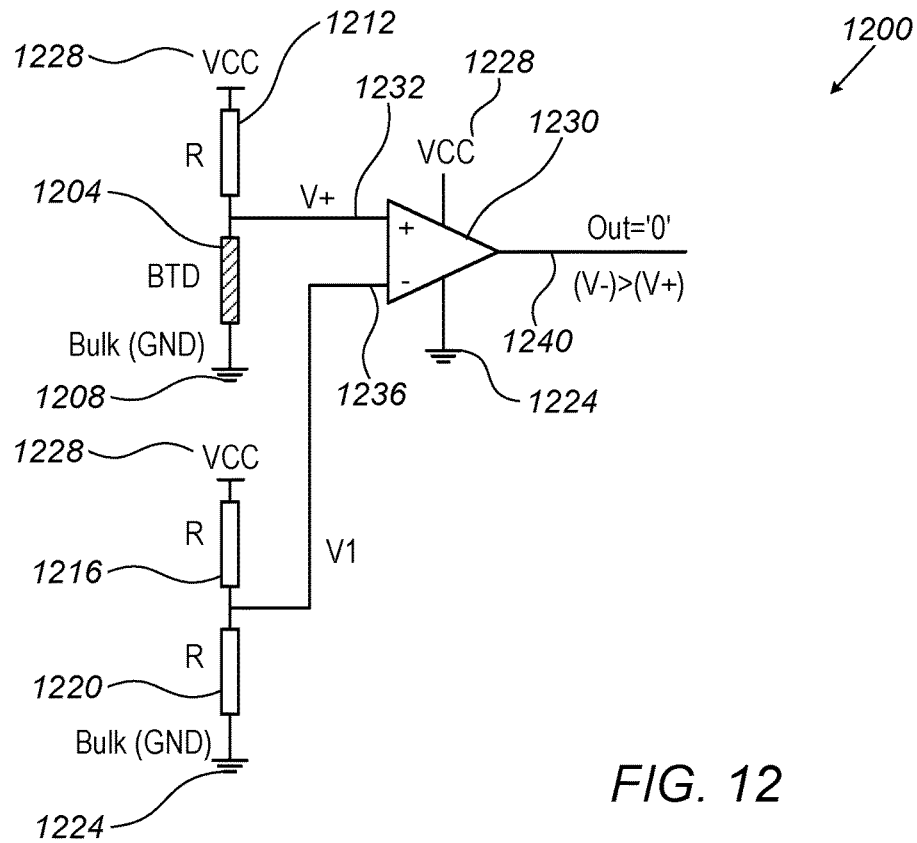
FIG. 12 illustrates an example of a circuit that includes a bulk thinning detector, in accordance with some embodiments of the presently disclosed subject matter.

Refer to FIG. 12 which illustrates an example of a circuit 1200 that includes a bulk thinning detector, in accordance with some embodiments of the presently disclosed subject matter.

A bulk thinning detector ("BTD") 1204, shown in circuit 1200, may be in the bulk, as described above. BTD 1204 may be connected to a ground 1208, due to contiguous conducting and bulk materials as discussed above. Three resistors ("R"), namely resistors 1212, 1216, and 1220 are also shown in circuit 1200. For the sake of example, it is assumed that the resistance of BTD 1204 is smaller than the resistance of each of resistors 1212, 1216, and 1220. For instance, the resistance of BTD 1204 may be half the resistance of each of resistors 1212, 1216, and 1220. Resistor 1220 may also be connected to ground, e.g. due to a connection to bulk material in the bulk. For clarity's sake, the ground that resistor 1220 is shown connected to is labeled as ground 1224 (i.e. with a different label than ground 1208).

The type(s) of resistors used for resistors 1212, 1216, and 1220 may vary depending on the embodiment. For example, in some embodiments, each of resistors 1212, 1216, and 1220 may be fabricated, e.g. in one or more active layers, by any appropriate Complementary metal-oxide-semiconductor ("CMOS") technology (e.g. by connecting the gate of an n-channel transistor to the source of the transistor).

A supply voltage ("VCC") 1228 may be connected to each of resistors 1212 and 1216, and to an operational amplifier ("comparator") 1230 thereby supplying power to circuit 1200. Comparator 1230 may also be connected to ground 1224.

Resistor 1212 may be connected (at the other end from supply voltage 1228) to BTD 1204 (e.g. via interconnect 1104 and/or 1108). Resistor 1216 may be connected (at the other end from supply voltage 1228) to resistor 1220. The voltage across BTD 1204 (V+, at an analog input terminal 1232) may be lower than the voltage across resistor 1220 (V−, at an analog input terminal 1236), as the resistance of BTD 1204 is assumed to be smaller than the resistance of resistor 1220. Comparator 1230 may detect that BTD 1204 is connected to ground 1208 from the comparison of the voltages V+ at analog input terminal 1232 and V− at analog input terminal 1236. Comparator 1230 may output a "0" value at an output terminal 1240. The "0" output value of comparator 1230 may be provided, e.g. to a processor in an active layer (e.g. central processing unit CPU), and/or e.g. to any other electronic component(s) in active layer(s) of the semiconductor device.

Figure 13:
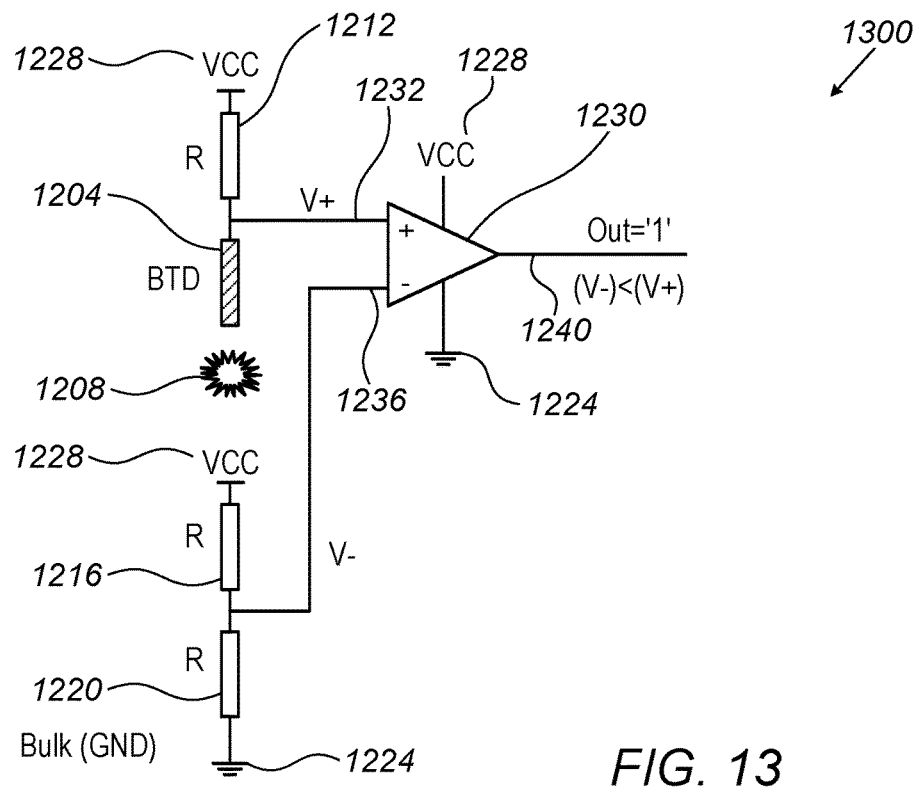
FIG. 13 illustrates a circuit similar to the circuit in FIG. 12, but with the bulk thinning detector disconnected from the ground, in accordance with some embodiments of the presently disclosed subject matter.

Refer now to FIG. 13, which illustrates a circuit 1300, similar to circuit 1200, but with BTD 1204 disconnected from ground 1208, in accordance with some embodiments of the presently disclosed subject matter.

For example, BTD 1204 may be disconnected from ground 1208, due to backside thinning of the semiconductor device which removed bulk material underneath and contiguous with conducting material(s) in the section corresponding to BTD 1204.

In the case of BTD 1204 being disconnected from ground 1208, the resistance of BTD 1204 may be replaced by the resistance of an open circuit, and the voltage, V+, at analog input terminal 1232 may therefore be increased compared to the case of BTD 1204 being connected to ground 1208. The voltage, V+, at analog input terminal 1232 may therefore be greater than the voltage at analog input terminal V− 1236, due to the resistance of an open circuit being larger than the resistance of resistor 1220. Comparator 1230 may detect that there is backside thinning by detecting, from the comparison of the voltages V+ at analog input terminal 1232 and V− at analog input terminal 1236, that BTD 1204 is disconnected from ground 1208. As a result of comparing the voltages V+ at analog input terminal 1232 and V− at analog input terminal 1236, comparator 1230 may output a "1" at output terminal 1240. The output value of "1" may be provided e.g. to a processor in an active layer (e.g. central processing unit CPU) and/or e.g. to any other electronic component(s) in active layer(s), adapted to perform at least one action upon detection that BTD 1204 is disconnected from the ground (the disconnection from ground being indicative of backside thinning).

Figure 14:
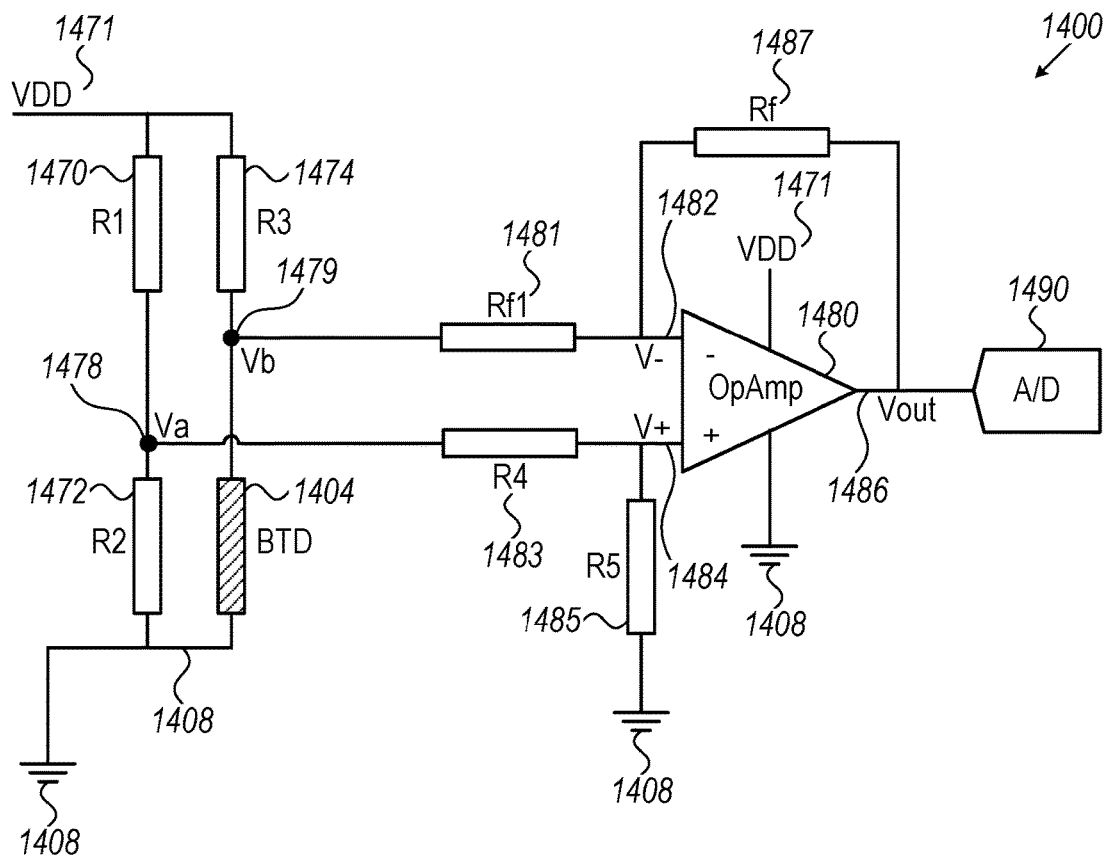
FIG. 14 illustrates another example of a circuit that includes a bulk thinning detector, in accordance with some embodiments of the presently disclosed subject matter.

Refer to FIG. 14 which illustrates another example of a circuit 1400 that includes a bulk thinning detector, in accordance with some embodiments of the presently disclosed subject matter.

A bulk thinning detector ("BTD") 1404, shown in circuit 1400, may be in the bulk as discussed above. BTD 1404 may be connected to a ground 1408, due to contiguous conducting and bulk materials as discussed above.

A Wheatstone bridge in circuit 1400 may include BTD 1404 and the resistors: R1 1470, R2 1472, and R3 1474. The resistance of BTD 1404 is assumed to be (initially) equivalent to the resistance of each of resistors R1 1470, R2 1472, and R3 1474, so that the Wheatstone bridge may be balanced.

A supply voltage ("VDD") 1471 may be connected to each of resistors R1 1470 and R3 1474, and to an operational amplifier ("comparator") 1480, thereby supplying power to circuit 1400. R1 1470 may be connected (at the other end from supply voltage 1471) to R2 1472 which in turn may be connected to ground 1408 (e.g. due to a connection to bulk material in the bulk). Resistor R3 1474 may be connected (at the other end from supply voltage 1471) to BTD 1404 (e.g. via interconnect 1104 and/or 1108). The voltage "Va" at point 1478 of circuit 1400 may represent the voltage across R2 1472. The voltage "Vb" at point 1479 of circuit 1400 may represent the voltage across BTD 1404.

An analog input terminal 1482 to comparator 1480 may be connected to a resistor Rf1 1481 which in turn may be connected to resistor R3 1474 and BTD 1404 (e.g. via interconnect 1104 and/or 1108), at the same point where resistor R3 1474 and BTD 1404 are connected to each other. Input terminal 1482 may also be connected to a resistor Rf 1487 which in turn may be connected to an output terminal 1486 of comparator 1480. The voltage, V−, at input terminal 1482 may equal the sum of the voltages across resistor Rf1 1481 and BTD 1476, and may equal the sum of the voltage across resistor Rf 1487 and the voltage outputted ("Vout") at output terminal 1486.

An analog input terminal 1484 to comparator 1480 may be connected to resistors R4 1483 and R5 1485. Resistor R5 1485 may be connected (at the other end from input terminal 1484) to ground 1408. Resistor R4 1483 may be connected (at the other end from input terminal 1484) to resistors R1 1470 and R2 1472, at the same point where resistor R1 1470 and R2 1472 are connected to each other. Resistors R4 1483 and R5 1485 may be assumed to have equivalent resistances. The voltage, V+, at analog input terminal 1484 may equal the voltage across R5 1485, and may equal the sum of the voltages across resistors R4 1483 and R2 1472. Comparator 1480 may also be connected to ground 1408.

The type(s) of resistors used for resistors 1470, 1472, 1474, 1481, 1483, 1485, or 1487 may vary depending on the embodiment. For example, in some embodiments, each of the above-mentioned resistors may be fabricated e.g. in one or more active layers, by any appropriate CMOS technology.

The voltage outputted ("Vout") at output terminal 1486 of comparator 1480 may be indicative of whether or not the Wheatstone bridge is balanced or unbalanced (e.g. unbalanced due to the resistance of BTD 1404 being replaced by an open circuit or due to a change in resistance of BTD 1404).

In circuit 1400, $$Vout = \frac{Rf}{Rf1} \times (V^+ - V^-).$$

For simplicity's sake, although not limiting, it is assumed that the resistance of resistor Rf 1487 is equivalent to the resistance of Rf1 1481, and therefore there is a unity gain for $$\frac{Rf}{Rf1}.$$

Consequently, Vout equals $1 \times (V^+ - V^-)$.

If all of the resistances in the Wheatstone bridge (i.e. the resistance of each of BTD 1404, R1 1470, R2 1472, and R3 1474) are equivalent, then the voltage Va at point 1478 may equal the voltage Vb at point 1479. Consequently the voltage V+ at input terminal 1484 may equal the voltage V− at input terminal 1482. Using the above-mentioned equation for the output voltage, Vout, it may be calculated that the output voltage may be approximately zero. It is noted that the Wheatstone bridge may continue to be balanced, as long as there is no backside thinning that causes the Wheatstone bridge to become unbalanced.

However, backside thinning which removes bulk material underneath and contiguous with conducting material(s) in the section corresponding to BTD 1408, may cause BTD 1404 to be disconnected from ground 1408. Additionally or alternatively, backside thinning which leads to a change in the geometry of the conducting material(s) may cause a change in the resistance of BTD 1404. It is possible that backside thinning may have left BTD 1404 connected to ground 1408, e.g. by not removing all of the bulk material that is underneath and contiguous with conducting material(s) of BTD 1404. Alternatively, it is possible that backside thinning may have disconnected BTD 1404 from ground 1408 by removing all of the bulk material that is underneath and contiguous with conducting materials(s) of BTD 1404 but that the attacker may then reconnect BTD 1404 to ground 1408, e.g. by providing a connection between the conducting material(s) of BTD 1404 exposed during the thinning to other bulk material or to another ground (e.g. external to the semiconductor device). The backside thinning may have changed the geometry of the conducting materials(s), for example by removing and/or moving some of the conducting material(s) during the thinning regardless of whether or not the backside thinning disconnected BTD 1404 from ground 1408, and/or for example by disconnecting BTD 1404 from ground 1408, leading to the moving of some of the conducting material(s) and/or the addition of some more conducting material(s) in order to make a reconnection to ground 1408, if such a reconnection is made.

Therefore, circuit 1400 may be adapted to detect that there is backside thinning by detecting, from the unbalanced Wheatstone bridge, that BTD 1404 is disconnected from ground 1408, or that the resistance of BTD 1404 is changed.

It is assumed first that due to backside thinning, BTD 1404 is no longer connected to ground 1408. In such a case, the resistance of BTD 1404 may be replaced by the resistance of an open circuit. The resistance of an open circuit may be larger than the resistances of each of resistors R1 1470, R2 1472, and R3 1474. The Wheatstone bridge may therefore be unbalanced. Assuming that circuit 1400 is supplied with power (e.g. by being connected to VDD 1471), voltage Va at point 1478 may be less than voltage Vb at point 1479. Consequently voltage V+ at input terminal 1484 may be less than voltage V− at input terminal 1482. Using the above-presented equation, Vout may be calculated as being less than zero.

It is assumed now that BTD 1404 is connected to ground 1408, e.g. not having been disconnected or having been reconnected, but that the thinning has led to a change in the geometry of the conducting material(s) of the BTD 1404, which resulted in a lowered resistance of BTD 1404. For example, the thinning may have removed some of the conducting material(s). Although the change that is now being described results in a decrease in the resistance of BTD 1404, circuit 1400 may be adapted to detect either an increase or a decrease in resistance of BTD 1404. For simplicity's sake, it is assumed that the resistance of BTD 1404 has decreased so that the resistance of BTD 1404 is smaller than the resistances of each of resistors R1 1470, R2 1472, and R3 1474. The Wheatstone bridge may therefore be unbalanced. Assuming circuit 1400 is supplied with power (e.g. by being connected to VDD 1470), voltage Va at point 1478 may be greater than voltage Vb at point 1479. Consequently voltage V+ at input terminal 1484 may be greater than voltage V− at input terminal 1482. Using the above-presented equation, Vout may be calculated as being greater than zero. (If the resistance of BTD 1404 had increased due to the backside thinning, then Vout would have instead been calculated to be less than zero).

Output terminal 1486 of comparator 1480 may be connected to an input terminal of an analog to digital converter ("A/D") 1490. A/D 1490 may translate the value of Vout to a digital word. A/D 1490 may output the digital word to e.g. to a processor in an active layer (e.g. central processing unit CPU) and/or e.g. to any other electronic component(s) in active layer(s) of the semiconductor device, adapted to perform at least one action upon detection that BTD 1404 is disconnected from ground 1408 or has resistance thereof changed (the disconnection or change in resistance being indicative of backside thinning).

As mentioned above, in some embodiments, there may be one or more bulk thinning detectors in the bulk, meaning one or more sections of the bulk that include conducting material(s). For example, fabrication of a plurality of bulk thinning detectors connected to the ground may be in accordance with stages 108 to 120 of method 100 discussed above. The fabrication may include forming trenches by removing bulk material, depositing respective material(s) along inner surfaces of the trenches, removing the respective deposited material(s) from respective bottom inner surfaces of the trenches, and depositing respective conducting material(s) in the trenches. Depending on the embodiment, the same material(s) and/or different materials may be deposited along the inner surfaces of the various trenches, and/or the same conducting material(s) and/or different conducting materials may be deposited in the various trenches. For instance, in some embodiments, a particular conducting material may be used in all the trenches.

In embodiments where there is a plurality of bulk thinning detectors, the number of bulk thinning detectors may vary depending on the embodiment. For example, in some of such embodiments, there may be four bulk thinning detectors, whereas in other of such embodiments there may be fewer or more. In embodiments where there is a plurality of bulk thinning detectors, the positioning of the bulk thinning detectors in the bulk may vary depending on the example. For example, one or more bulk thinning detectors may be positioned close to an area that is under certain block(s) in the active layer(s), for instance where the block(s) may be block(s) included in electronic component(s) in the active layer(s). Continuing with the example, such block(s) may include, for instance, memory (e.g. one time password) that stores secrets (e.g. embedded keys), etc. Continuing with the example, local trenching (e.g. during an attack) may be more likely to target certain (e.g. more critical) block(s). Additionally or alternatively, for example, one or more bulk thinning detectors may be positioned near the corners of the bulk, because parallel polishing (e.g. during an attack) may be likely to polish at least one of the corners. Additionally or alternatively, for example, bulk thinning detectors may be spread out over the bulk.

In embodiments with a plurality of bulk thinning detectors, the sections including the conducting material(s) that are the bulk thinning detectors may or may not all have the same geometry/ies. For example the section(s) may not all have a same depth or range of depths. Additionally or alternatively, the sections may or may not all have the same cross-sectional dimensions. Moreover, in embodiments with a plurality of sections, the sections may or may not all include the same conducting material(s), and therefore may not all have the same resistivity/ies. Consequently, the resistances of the various bulk thinning detectors that are respectively the sections including conducting material(s) may or may not all be equivalent. In embodiments with a plurality of sections, separate circuits and/or the same circuit(s) may include the various bulk thinning detectors. Circuit(s) which may be adapted to detect whether or not the various bulk thinning detectors are connected to ground and/or have changed resistance, may be designed to take into account resistance values of the various bulk thinning detectors which may or may not vary from one another.

Figure 15:
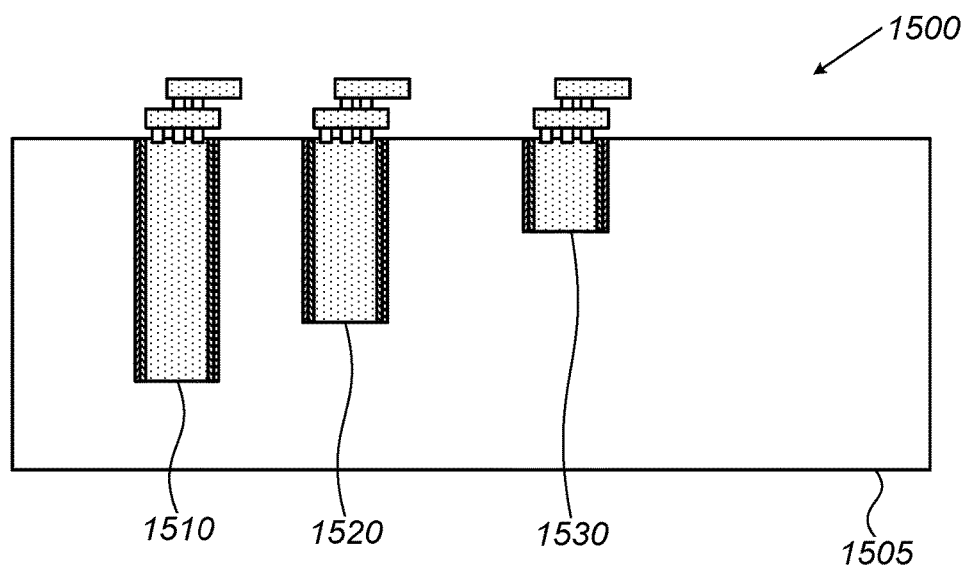
FIG. 15 illustrates an example of a front view of a cross section of a bulk that includes a plurality of bulk thinning detectors, in accordance with some embodiments of the presently disclosed subject matter.

Refer to FIG. 15 which illustrates an example of a front view 1500 of a cross section of a bulk that includes a plurality of bulk thinning detectors, in accordance with some embodiments of the presently disclosed subject matter.

Three bulk thinning detectors are shown in FIG. 15, namely bulk thinning detectors 1510, 1520 and 1530, in bulk 1505 (e.g. silicon bulk). Bulk thinning detector 1510 may extend from the top of bulk 1505, approximately two hundred micro meters ("µm" also referred to as microns) below the top surface of bulk 1505. Bulk thinning detector 1520 may extend from the top of bulk 1505, approximately one hundred and fifty micro meters below the top surface of bulk 1505. Bulk thinning detector 1530 may extend from the top of bulk 1505, approximately one hundred micro meters below the top surface of bulk 1505.

Figure 16:
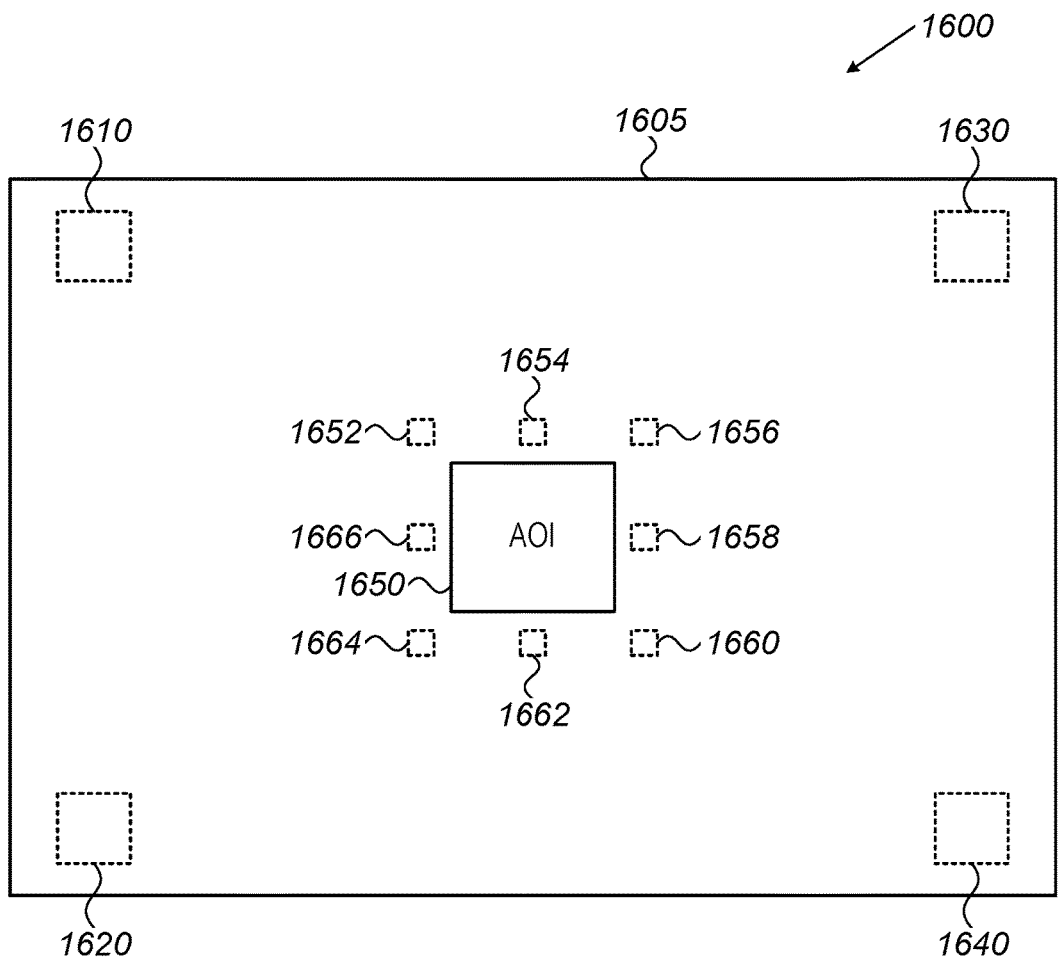

FIGS. 16, 17 and 18 illustrate examples of top views 1600, 1700 and 1800 respectively of a bulk that includes a plurality of bulk thinning detectors, in accordance with some embodiments of the presently disclosed subject matter.

In FIG. 16, (corner) bulk thinning detectors 1610, 1620, 1630 and 1640 may be located near the corners of a bulk 1605. Bulk thinning detectors 1610, 1620, 1630, and 1640 may extend, for example, approximately 200 microns below the top surface of bulk 1605. Bulk thinning detectors 1610, 1620, 1630, and 1640 may detect overall bulk thinning, e.g. bulk thinning performed using a parallel polishing process. Bulk thinning detectors 1610, 1620, 1630, and 1640 may be positioned near the four corners in order that a slight tilt in the thinning process may trigger at least one of the bulk thinning detectors However, in other embodiments there may not necessarily be bulk thinning detectors positioned near all of the corners. In some cases, how near a particular bulk thinning detector may be positioned to the corner, may determine the degree of tilt in the thinning process direction that may trigger the bulk thinning detector.

In FIG. 16, other bulk thinning detectors may be located close to an area of interest (AOI) 1650. Bulk thinning detectors 1652, 1654, 1656, 1658, 1660, 1660, 1662, 1664, and 1666, for instance, are shown around area or interest 1650. For example, in some cases a bulk thinning detector that is located close to area of interest 1650, may be positioned sufficiently close to area of interest 1650, such that upon local trenching around the area of interest, the part of the bulk, that is underneath and contiguous with the portion of the conducting material(s) in the section corresponding to the bulk thinning detector, is removed. Area of interest 1650 may be any area which is of interest. Area of interest 1650 may, for instance, be an area under certain block(s) in active layer(s). Each of bulk detectors 1652, 1654, 1656, 1658, 1660, 1660, 1662, 1664, and 1666 around the area of interest may extend, for example, less deep in bulk 1605 than corner bulk thinning detectors 1610, 1620, 1630 and 1640 may extend. Continuing with the example, each of bulk detectors 1652, 1654, 1656, 1658, 1660, 1660, 1662, 1664, and 1666 around area of interest 1650 may extend, e.g. between approximately 100 microns to approximately 150 microns below the top surface of bulk 1605. Each of bulk thinning detectors 1652, 1654, 1656, 1658, 1660, 1660, 1662, 1664, and 1666 around the area of interest may, for instance, have a smaller cross-sectional area than a bulk thinning detector near the corner of bulk 1605, e.g. where a smaller cross-sectional area may be represented by a smaller square in FIGS. 16 to 18.

FIG. 17 depicts exposed corner (e.g. approximately 200 micron) bulk thinning detectors 1710, 1720, 1730, and 1740 that may be exposed, for example, due to a parallel polishing process. Bulk thinning detectors 1710, 1720, 1730 and 1740 may be the exposed versions of bulk thinning detectors 1610, 1620, 1630 and 1640 (FIG. 16) respectively. Exposed bulk thinning detectors 1710, 1720, 1730, 1740 are marked in FIG. 17 with hatching lines to indicate exposure. Bulk thinning detectors 1652, 1654, 1656, 1658, 1660, 1662, 1664, and 1666 around area of interest 1650 are shown unexposed in FIG. 17.

Bulk 1705 may represent what remains of bulk 1605 after parallel polishing has removed some of the bulk material. For example the parallel polishing may have caused the depth of bulk 1705 to be more than approximately 150 microns (since the bulk thinning detectors around area of interest 1650 are not exposed), but less than or equal to approximately 200 microns (since bulk thinning detectors 1710, 1720, 1730 and 1740 are exposed). For example, an attacker who may want to thin the backside of a semiconductor device may begin the thinning by parallel polishing the backside of the semiconductor device. Due to the thinning of the backside, causing the depth of bulk 1705 to be more than approximately 150 microns but less than or equal to approximately 200 microns, bulk thinning detectors 1710, 1720, 1730, and 1740 may be disconnected from the ground (as there may no longer be bulk material contiguous and underneath conducting material(s) of bulk thinning detectors 1710, 1720, 1730, and 1740). However, bulk thinning detectors 1652, 1654, 1656, 1658, 1660, 1662, 1664, and 1666 may remain connected to the ground (as there may still be bulk material that is contiguous and underneath conducting material(s) of bulk thinning detectors 1652, 1654, 1656, 1658, 1660, 1662, 1664, and 1666).

FIG. 18 depicts the bulk thinning detectors around an area of interest 1850 exposed, e.g. due to local trenching. A local trench 1870 may be formed by thinning the backside of a semiconductor device, for example with a focused ion beam ("FIB") around the area of interest 1850 (assumed for simplicity's sake to be the same area of interest as area of interest 1650). Bulk 1805 may represent what remains of bulk 1605 after local trenching (or in other words after local trench 1870 has been formed).

Due to the local trenching, e.g. carried out by an attacker, the bulk thinning detectors around area of interest 1850 may be exposed. Positioning the bulk thinning detectors as close as possible to the perimeter of the area of interest may make it more likely that local trenching around the area of interest may expose the bulk thinning detectors. Bulk thinning detectors 1852, 1854, 1856, 1858, 1860, 1862, 1864, and 1866 may be the exposed versions of bulk thinning detectors 1652, 1654, 1656, 1658, 1660, 1662, 1664, and 1666 (FIG. 16) respectively, and are therefore marked in FIG. 18 with hatching lines to indicate exposure. Bulk thinning detectors 1852, 1854, 1856, 1858, 1860, 1862, 1864, and 1866 may be disconnected from the ground due to the local trenching (as there may no longer be bulk material underneath and contiguous with conducting material(s) of bulk thinning detectors 1852, 1854, 1856, 1858, 1860, 1862, 1864, and 1866.) However, bulk thinning detectors 1610, 1620, 1630, and 1640 may not be exposed by the local trenching and may remain connected to the ground (as there may still be bulk material that is contiguous and underneath conducting material(s) of bulk thinning detectors 1610, 1620, 1630, and 1640).

In some embodiments, bulk thinning may expose at least one corner bulk thinning detector (e.g. at least one of corner bulk thinning detectors 1610, 1620, 1630, and 1640 depicted in FIG. 16) as well as at least one bulk thinning detector close to an area of interest (e.g. at least one of bulk thinning detectors 1652, 1654, 1656, 1658, 1660, 1662, 1664, and 1666 depicted in FIG. 16 around area of interest 1650).

Figure 19C:
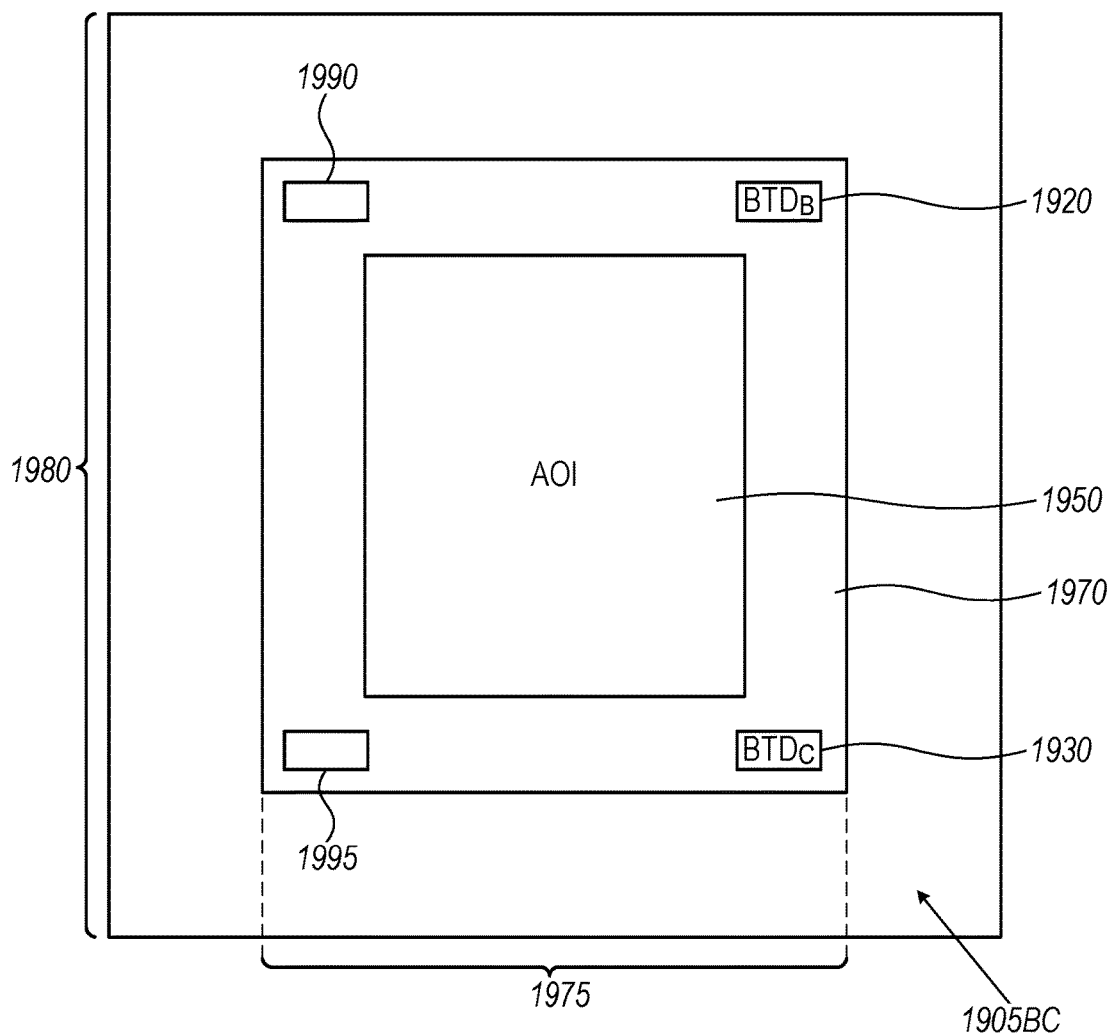
FIG. 19C illustrates another example of a top view of a bulk that includes a plurality of bulk thinning detectors, in accordance with some embodiments of the presently disclosed subject matter.

FIGS. 19A and 19B illustrate front views 1900A and 1900B of a cross section of a bulk 1905 that includes a plurality of bulk thinning detectors, in accordance with some embodiments of the presently disclosed subject matter. FIG. 19C illustrates a top view 1900C of bulk 1905, in accordance with some embodiments of the presently disclosed subject matter. Bulk 1905 is labeled "1905A" in FIG. 19A, and "1905BC" is FIGS. 19B and 19C after local trenching has occurred, but will be referred to simply as "bulk 1905" in the description of FIGS. 19A, 19B, and 19.

Four bulk thinning detectors, namely $BTD_A$ 1910, $BTD_B$ 1920, $BTD_C$ 1930 and $BTD_D$ 1940 in bulk 1905 are illustrated in FIG. 19A. $BTD_B$ 1920 and $BTD_C$ 1930 are close to an area of interest 1950. Area of interest 1950 may be any area of bulk 1905 which is of interest, for example an area that may be under certain block(s) in one or more active layer(s).

A trench 1970 formed by FIB is illustrated in FIG. 19B. Typically although not necessarily, a trench such as trench 1970 that is formed by FIB is not formed at a 90 degree angle to bulk 1905. The area of trench 1970, formed by FIB, is typically although not necessarily larger than the area of area of interest 1950. Due to the larger area, the formation of trench 1970 may expose $BTD_B$ 1920 and $BTD_C$ 1930.

The area 1975 of trench 1970, compared to the area 1980 of the semiconductor device, may be seen in FIG. 19C. As may be seen from FIG. 19C, $BTD_B$ 1920 and $BTD_C$ 1930, as well as two other bulk thinning detectors 1990 and 1995, are within area 1975 of trench 1970, and are therefore exposed.

Although FIGS. 16, 17, 18, 19A, 19B, and 19C show bulk thinning detectors close to an area of interest (e.g. around the area of interest), in some embodiments, bulk thinning detector(s) may be positioned within the area of interest, in addition to or instead of close to the area of interest. Bulk thinning detectors shown in FIG. 15, 16, 17, 18, 19A, 19B, or 19C may be fabricated, for example, in accordance with stages 108 to 120 of method 100.

When the bulk of a semiconductor device includes a plurality of bulk thinning detectors, the number of bulk thinning detectors, the positioning of the bulk thinning detectors, whether or not the depths or ranges of depths of the bulk thinning detectors are all the same depth or range of depths, the depths or ranges of depths of the bulk thinning detectors, whether or not the cross-sectional areas of the bulk thinning detectors are all the same, the cross-sectional areas of the bulk thinning detectors, whether or not the shapes of the bulk thinning detectors are all the same shape, the shapes of the bulk thinning detectors, whether or not symmetry or asymmetry is common to all the bulk thinning detectors, symmetry/asymmetry of the bulk thinning detectors, etc. may vary depending on the embodiment and are therefore not limited by the illustrations in FIGS. 15, 16, 17, 18, 19A, 19B, and 19C. For example, an engineer may determine an optimal positioning of one or more bulk thinning detectors in the bulk.

In embodiments with a plurality of bulk thinning detectors, circuit(s) may be designed which in addition to detecting whether there is backside thinning, may detect the amount of thinning and/or the location of thinning. For example, the circuit(s) may be adapted to detect the amount of thinning and/or location of thinning by detecting which, if any, of the bulk detector(s) is disconnected from the ground and/or has a changed resistance. However, in some other embodiments with a plurality of bulk thinning detectors, circuit(s) may be designed that will detect backside thinning, possibly with an increased likelihood of detection than if a sole bulk thinning detector were included, but without detecting the amount and/or location of thinning. It is noted that as illustrated in FIGS. 15, 16, 17, 18, 19A, 19B, and 19C, sections corresponding to various bulk thinning detectors may be positioned in various locations and/or may extend to various depths or ranges of depths, and therefore it is possible that the circuit may detect disconnection or change in resistance only for a subset of the bulk thinning detectors.

Figure 20:
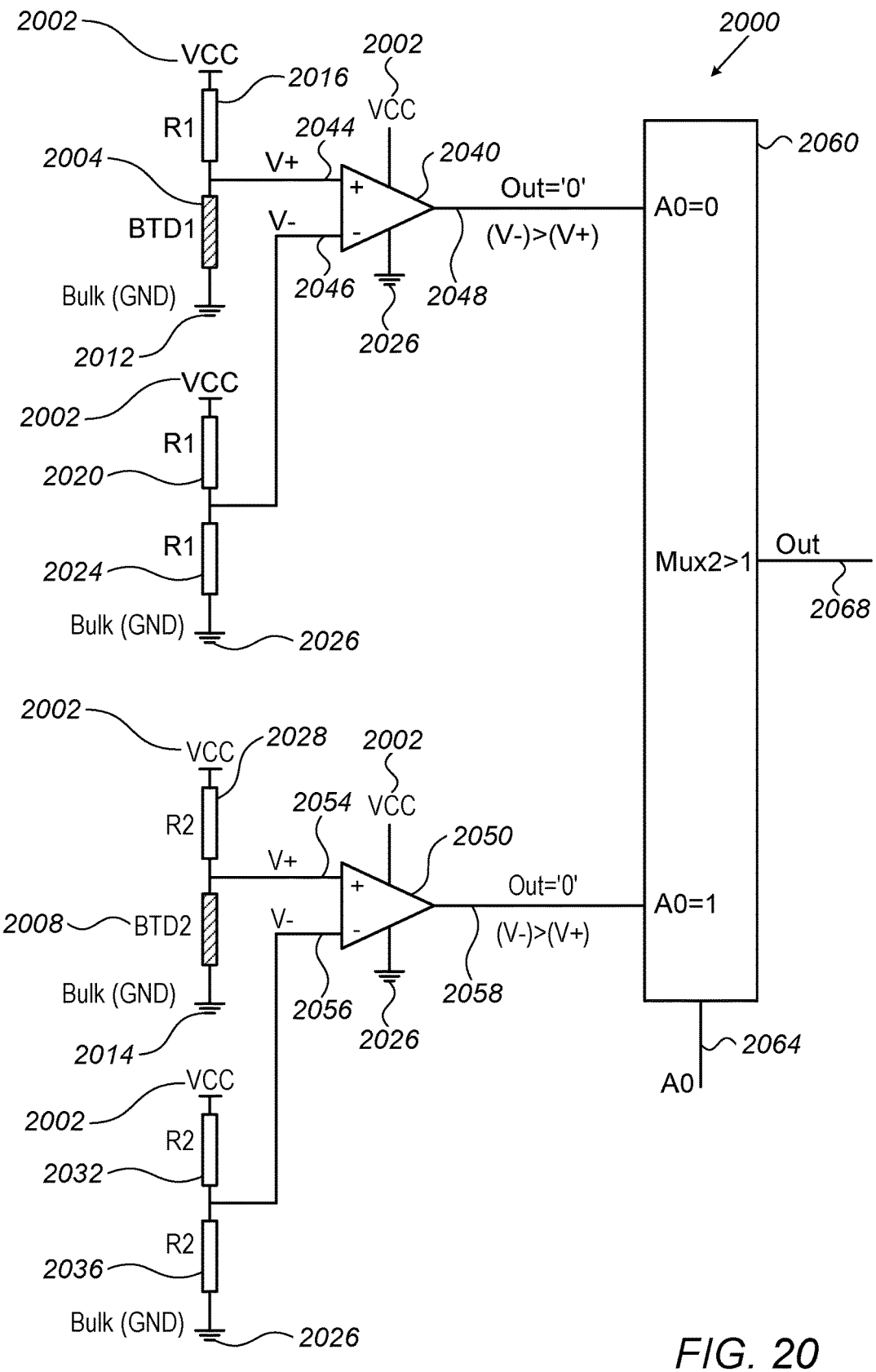
FIG. 20 illustrates an example of a circuit that includes two bulk thinning detectors, in accordance with some embodiments of the presently disclosed subject matter.

Refer now to FIG. 20 which illustrates an example of a circuit 2000 that includes two bulk thinning detectors, in accordance with some embodiments of the presently disclosed subject matter.

In FIG. 20, two bulk thinning detectors, illustrated as $BTD_1$ 2004 and $BTD_2$ 2008 in circuit 2000, may be in the bulk, as described above. For example, $BTD_1$ 2004 and $BTD_2$ 2008 may be any two of the bulk thinning detectors illustrated in any of FIG. 15, 16, 17, 18, 19A, 19B, or 19C. Depending on the embodiment, $BTD_1$ 2004 and $BTD_2$ 2008 may or may not be characterized by different resistances. For example, in some embodiments $BTD_1$ 2004 may extend deeper into the bulk than $BTD_2$ 2008 and assuming all other factors are equivalent, $BTD_1$ 2004 may be characterized by a higher resistance than $BTD_2$ 2008.

$BTD_1$ 2004 and $BTD_2$ 2008 may be connected to ground 2012 and 2014 respectively, due to contiguous conducting and bulk materials as discussed above. For clarity, grounds shown in FIG. 20 are labeled differently.

Six resistors $R_1$ namely resistors $R_1$ 2016, $R_1$ 2020, $R_1$ 2024, $R_2$ 2028, $R_2$ 2032, and $R_2$ 2036 are also shown in circuit 2000. For the sake of example, it is assumed that the resistance of $BTD_1$ 2004 is smaller than the resistance of each of resistors $R_1$ 2016, $R_1$ 2020, and $R_1$ 2024, e.g. half of the resistance. Similarly, for the sake of example, it is assumed that the resistance of $BTD_2$ 2008 is smaller than the resistance of each of resistors $R_2$ 2028, $R_2$ 2032, and $R_2$ 2036, e.g. half of the resistance. Resistors $R_1$ 2024, $R_2$ 2036 may be connected to ground 2026, e.g. due to a connection to bulk material in the bulk.

The type(s) of resistors used for $R_1$2016, $R_1$ 2020, $R_1$ 2024, $R_2$ 2028, $R_2$ 2032, and $R_2$ 2036 may vary depending on the embodiment. For example, in some embodiments, each of resistors $R_1$ 2016, $R_1$ 2020, $R_1$ 2024, $R_2$ 2028, $R_2$ 2032, and $R_2$ 2036, e.g. in one or more active layers, may be fabricated by any appropriate CMOS technology. Depending on the embodiment, the resistance value of each of resistors $R_1$ 2016, $R_1$ 2020, and $R_1$ 2024, may or may not be equivalent to the resistance value of $R_2$ 2028, $R_2$ 2032, and $R_2$ 2036.

A supply voltage ("VCC") 2002 may be connected to each of resistors $R_1$ 2016, $R_1$ 2020, $R_2$ 2028, and $R_2$ 2032, and to operational amplifiers ("comparators") 2040 and 2050, thereby supplying power to circuit 2000. Comparators 2040 and 2050 may be connected to ground 2026. Resistor $R_1$ 2016 may be connected (at the other end from supply voltage 2002) to $BTD_1$ 2004 (e.g. via interconnect 1104 and/or 1108). Resistor $R_2$ 2028 may be connected (at the other end from supply voltage 2002) to $BTD_2$ 2008 (e.g. via interconnect 1104 and/or 1108). Resistor $R_1$ 2020 may be connected (at the other end from supply voltage 2002) to resistor $R_1$ 2024. Resistor $R_2$ 2032 may be connected (at the other end from supply voltage 2002) to resistor $R_2$ 2036.

A voltage, V+, across $BTD_1$ 2004 (at an analog input terminal 2044) may be compared to a voltage, V−, across resistor $R_1$ 2024 (at an analog input terminal 2046), by comparator 2040. The comparison may result in a "0" at an output terminal 2048 of comparator 2040, since the voltage across $BTD_1$ 2004 may be less than the voltage across resistor $R_1$ 2024, due to $BTD_1$ 2004 having a lower resistance than resistor $R_1$ 2024. Similarly, a voltage, V+, across $BTD_2$ 2008 (at an analog input terminal 2054) may be compared to a voltage, V−, across resistor $R_2$ 2036 (at an analog input terminal 2056), by comparator 2050. The comparison may result in a "0" at an output terminal 2058 of comparator 2050, since the voltage across $BTD_2$ 2008 may be less than the voltage across resistor $R_2$ 2036, due to $BTD_2$ 2008 having a lower resistance than resistor $R_2$ 2036.

Comparator output terminals 2048 and 2058 are shown connected to a multiplexer 2060 included in circuit 2000. A selector line A0 2064 selects the value at one of comparator output terminals 2048 and 2058 for output at an output terminal 2068 of multiplexer 2060. For example, the output from multiplexer 2060 may be provided to a processor in an active layer (e.g. central processing unit CPU) and/or to any other electronic component(s) in active layer(s) of the semiconductor device.

In circuit 2000, if A0 2064 is set to 0, then the value on comparator output terminal 2048 may be selected to be output at output terminal 2068 of multiplexer 2060. If A0 2064 is set to 1, then the value on comparator output terminal 2058 may be selected to be output at output terminal 2068 of multiplexer 2060. In circuit 2000, regardless of the value of A0 2064, the value "0" is output at output terminal 2068, as both values at terminals 2048 and 2058 are zero.

Figure 21:
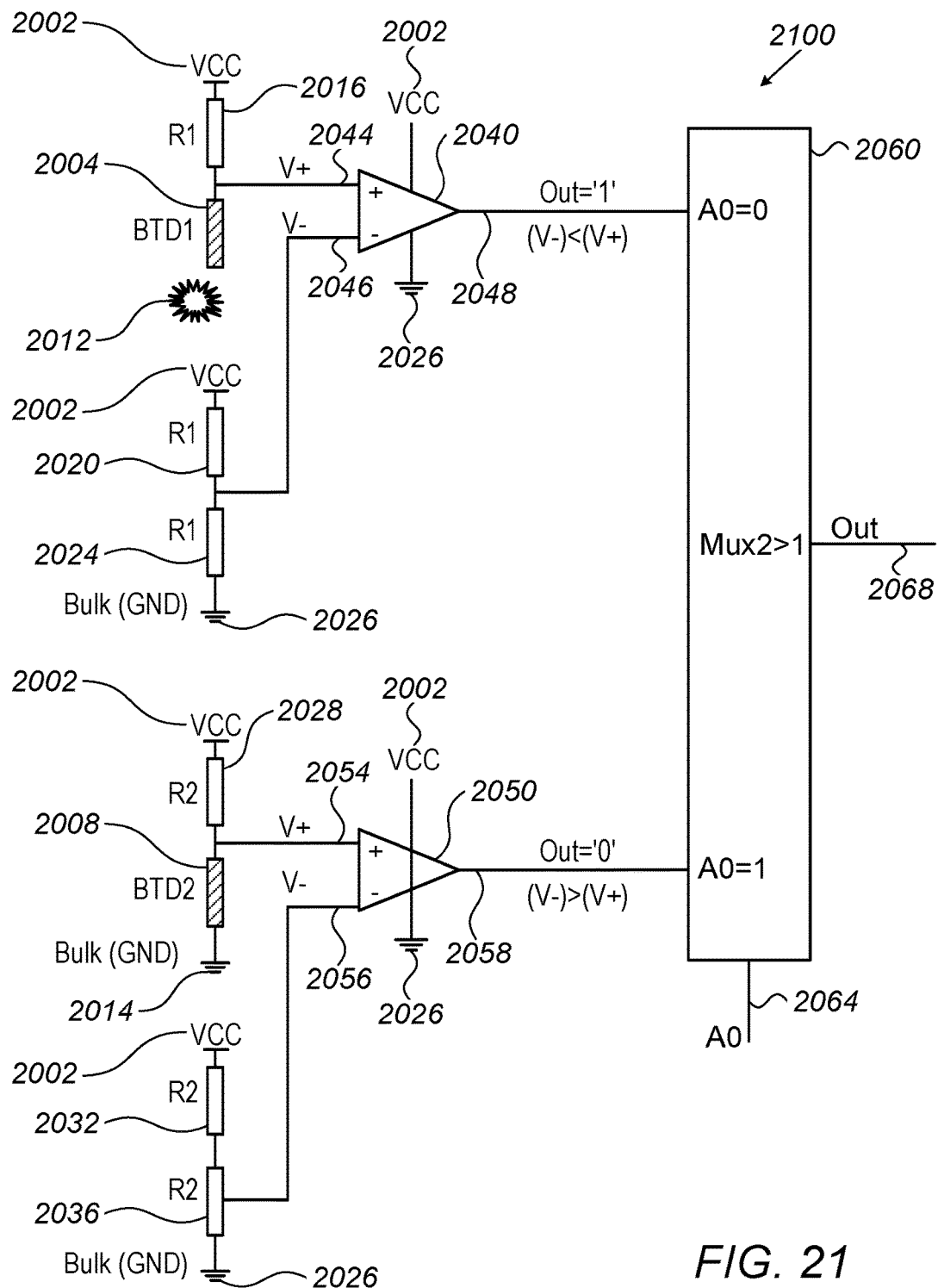
FIG. 21 illustrates a circuit similar to the circuit in FIG. 20, but with one of the bulk thinning detectors disconnected from the ground, in accordance with some embodiments of the presently disclosed subject matter.

Refer now to FIG. 21 which illustrates a circuit 2100 similar to circuit 2000, but with $BTD_1$ 2004 disconnected from ground 2012, in accordance with some embodiments of the presently disclosed subject matter.

For example, $BTD_1$ 2004 may be disconnected from the ground 2012 due to backside thinning of the bulk which removed bulk material underneath and contiguous with conducting material(s) in the section corresponding to BTD 2004.

In the case of disconnection from ground 2012, the resistance of $BTD_1$ 2004 may be replaced by the resistance of an open circuit, and the voltage V+ at analog input terminal 2044 may consequently be increased compared to when $BTD_1$ 2004 was connected to ground 2012. The comparison by comparator 2040, may result in a "1" at comparator output terminal 2048, since the voltage across $BTD_1$ 2004 may be greater than the voltage across resistor $R_1$ 2024, due to the open circuit having a larger resistance than resistor $R_1$ 2024. When A0 2064 is set to 0, the output at output terminal 2068 of multiplexer 2060 may also be 1. When A0 2064 is set to 1, the output at output terminal 2068 of multiplexer 2060 may be 0 (as in FIG. 20), because $BTD_2$ 2008 may (still) be connected to ground 2014.

Circuit 2100 may therefore detect that there is backside thinning. Circuit 2100 may further detect that the location of the backside thinning includes thinning under the location of the section corresponding to $BTD_1$ 2004, but not necessarily thinning under the location of the section corresponding to $BTD_2$ 2008. Circuit 2100 may additionally or alternatively detect that the amount of thinning under the location of the section corresponding to $BTD_1$ 2004 is equal to or more than the thickness of the bulk material that was underneath the section corresponding to $BTD_1$ 2004, but that the amount of thinning (if any) at the location of the section corresponding to $BTD_2$ 2008 may have been less than the thickness of the bulk material that was underneath the section corresponding to $BTD_2$ 2008.

The output of multiplexer 2060 may be provided, e.g. to a processor in the active layer (e.g. central processing unit CPU), and/or e.g. to any other electronic component(s) in active layer(s) of the semiconductor device, adapted to perform at least one action upon detection that $BTD_1$ 2004 and/or $BTD_2$ 2008 is disconnected from ground 2012 and/or 2014 respectively (the disconnection being indicative of backside thinning).

In some embodiments, a circuit may include a multiplexer that additionally or alternatively multiplexes the outputs of various analog digital converters such as A/D 1490 or outputs of various comparators such as comparator 1480, corresponding to various bulk thinning detectors.

It is noted that in some embodiments, a circuit which includes a plurality of bulk thinning detectors may detect whether there is backside thinning without necessarily detecting location and/or amount of thinning. For instance, the circuit may not distinguish between the bulk thinning detectors and may detect that there is backside thinning if at least one of the bulk thinning detectors is disconnected from the ground or has a changed resistance. In such an instance, the plurality of bulk thinning detectors may possibly increase the likelihood that backside thinning will be detected if occurring, compared to a single bulk thinning detector.

The circuit(s) that may be used in embodiments of the subject matter are not limited by any of the circuits illustrated in FIGS. 12, 13, 14, 20 and 21 and any appropriate circuit(s) may be used additionally or alternatively. For example, an engineer may design any appropriate circuit(s) that may include one or more bulk thinning detectors. It is noted that in the discussion above, any effect of temperature on resistance was ignored, for simplicity's sake. An engineer may design the bulk thinning detector(s) and resistor(s) that are to be used in circuit(s) so that relationships between the various resistances of the bulk thinning detectors, resistors, and open circuits (e.g. whether a particular resistance is equal to, larger or smaller than another resistance) discussed above with respect to the circuits illustrated in FIGS. 12, 13, 14, 20 and 21 or pertaining to any other appropriate circuit (s) may be valid, even under temperature variation.

The semiconductor device may be adapted, upon backside thinning of the semiconductor device being detected (e.g. by detecting at least one bulk thinning detector being disconnected from the ground and/or having a change in resistance), to perform one or more actions. For example, a processor in the semiconductor device may be adapted to perform one or more of the action(s) in some embodiments. As another example, an electronic component in the semiconductor device which may additionally or alternatively be adapted to perform action(s) may be a transistor with a heavy current. The transistor may be adapted to cause a fuse to blow, thus stopping power from being supplied to one or more electronic component(s) in the semiconductor device (e.g. to component(s) that include memory block(s)), e.g. and thereby performing the action of erasing memory. The action(s) that may be performed may vary depending on the embodiment. However for the sake of further illustration, some possible actions are now described. For example, an alert may be issued, e.g. an alert that may be output to an operator of a system that includes the semiconductor device. As another example, the semiconductor device may self-destruct. As another example, secrets such as embedded keys that may be included in the semiconductor device may be erased. As another example, content (e.g. not necessarily including secrets) in memory that is included in the semiconductor device may be erased. As another example, "garbage" data may be generated on a bus of a system that includes the semiconductor device. As another example, lower privileges may be configured that may prevent communications. As another example, some services may be denied.

In some embodiments, the action(s) that may be performed may be dependent on the location and/or amount of backside thinning. For example, more severe action(s) (e.g. stronger alert(s)) may be performed if the location of thinning is detected to be close to an area of interest that is under certain block(s) (e.g. more critical block(s)). Additionally or alternatively, more severe action(s) may be performed if the depth(s)/range of depth(s) of section(s) corresponding to bulk thinning detector(s) detected as being disconnected(s) from the ground, or having a change in resistance, is/are shallower because in such a case the amount of thinning may be larger and the thinning may therefore have reached nearer to the layer(s) above the bulk. As another example, additionally or alternatively, the action(s) may depend on the location of the thinning by being particular to the location. Continuing with the example, if there are first and second areas of interest and only bulk detector(s) close to the first area of interest is detected as being disconnected from the ground or having a change in resistance, then the action(s) may be tailored to block(s) above the first area of interest rather than to the block(s) above the second area of interest.

The functionality of a semiconductor device which includes bulk thinning detector(s) may vary depending on the embodiment. Such a semiconductor device may be adapted to perform at least one function, by including one or more electronic components in active layer(s) for performing the function(s). The bulk detector(s) may be included in circuit(s) for detecting backside thinning. In some cases, the electronic component(s) may be adapted to perform the function(s), as long as it is detected that the bulk thinning detector(s) are connected to the ground and there is no change in resistance for the bulk thinning detector(s). For example, memory in the semiconductor device, if any, may continue to store secrets and/or other content, etc.

The usage of bulk thinning detector(s) in a semiconductor device may be especially advantageous if the semiconductor device includes embedded keys, but a semiconductor device that includes bulk thinning detector(s) may not necessarily include embedded keys. A semiconductor device which includes bulk thinning detector(s) may or may not also include a TSV. For example, when dies are stacked, all of the stacked dies or only part of the stacked dies may include bulk thinning detector(s). Continuing with the example, in some cases only the bottom die may include bulk thinning detector(s) (e.g. if the stacked dies may not be disassembled without rendering the stacked dies inoperable).

Figure 22:
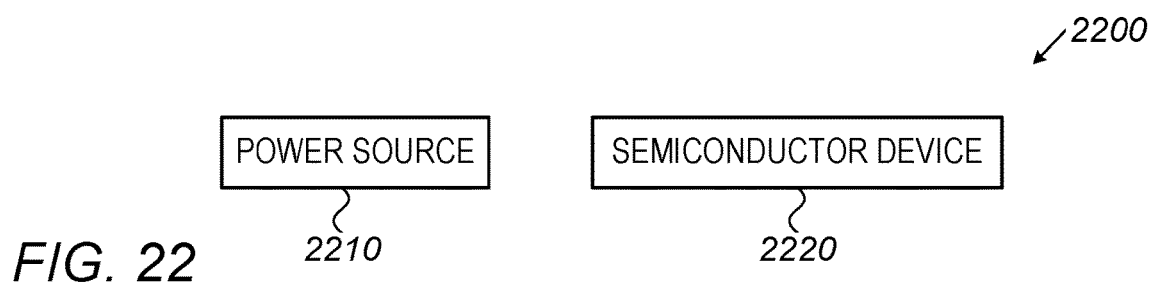
FIG. 22 is a block diagram of a system that includes a semiconductor device and a power source, in accordance with some embodiments of the presently disclosed subject matter.

A system that includes a semiconductor device with bulk thinning detector(s) may vary depending on the embodiment. In some embodiments, such a system may at least include a power source, in addition to the semiconductor device. FIG. 22 is a block diagram of a system 2200 that includes a semiconductor device and a power source, in accordance with some embodiments of the presently disclosed subject matter. When a power source 2210 supplies power to a semiconductor device 2220, e.g. via a connection that is not shown in FIG. 22, circuit(s) in semiconductor device 2220 that include bulk thinning detector(s) may operate and detect whether or not there is backside thinning of semiconductor device 2220. In some other embodiments, a semiconductor device that includes bulk thinning detector (s) may include an internal power source, instead of or in addition to a power source that is external to the semiconductor device.

Some embodiments of the presently disclosed subject matter may be advantageous compared to a light detector that may be included in an active layer of a semiconductor device. First, a light detector may only detect an attack that includes backside thinning if the backside thinning has progressed to a point where there is only approximately 5-20 microns of depth remaining in the bulk. It is noted that active circuitry (e.g. electronic component(s) in active layer(s) and interconnection(s) in interconnect layer(s) that interconnect such component(s)) in the semiconductor device may remain functional even if there is only approximately 5-20 microns of remaining depth. However, an attacker that uses a silicon immersion lens may view the active circuitry when the backside has been thinned by much less (e.g. so that the thickness of device is approximately 80 to 100 microns). In some embodiments, if the bulk includes a bulk thinning detector which may extend sufficiently deep into the bulk so that the depth from the top of the semiconductor device to the bottom of the bulk thinning detector is more than approximately 80 to 100 microns, the attack may be detected before a silicon immersion lens may be successfully used to view the active circuitry. Second, in some cases, during an attack the entire backside may be thinned coarsely until the semiconductor device is approximately 100 microns thick and then the attacker may thin in locations where a light detector is blind. Such coarse thinning may be detected in some embodiments of the subject matter, provided that a bulk thinning detector extends to a depth of approximately 100 microns or more from the top of the device.

Third, in some embodiments, it may be more difficult for an attacker to determine the location of a bulk thinning detector than to determine the location of a light detector due to the (possibly) smaller size of a bulk thinning detector and (possible) dispersion of bulk thinning detector(s) in the bulk. It is noted, that in contrast, a light detector may need to be large (e.g. approximately 10 microns×10 microns) in order to capture light. Fourth, a light detector may include complicated logic, have a relatively high current consumption, and stand out compared to other electronic components typically found in a semiconductor device. On the other hand, in some embodiments of the presently disclosed subject matter, circuit(s) for detecting whether there is backside thinning may include electronic components in the active layer(s) that may (possibly) be smaller and therefore take up less room than a light detector, may (possibly) have a lower current consumption, and may (possibly) look like other electronic component(s) typically found in a semiconductor device (e.g. comparator(s) and resistor(s) in the active layer(s) used in the detection circuit(s) may look like transistors used for other purposes). Other advantages of embodiments of the presently disclosed subject matter may be apparent from the description herein.

In the above description of example embodiments, numerous specific details were set forth in order to provide a thorough understanding of the subject matter. However, it will be understood by those skilled in the art that some examples of the subject matter may be practiced without such specific details. In other instances, well-known features have not been described in detail so as not to obscure the subject matter.

A device may be considered to be a semiconductor device if active layer(s) of the device includes at least one semiconductor material, regardless of the type(s) of material in the other layers of the device, or of other material(s), if any, in the active layer(s). In the description herein reference to the primary material included in the active layer(s) means the material which is used in greater quantity in the active layer(s) than any other material that is used in the active layer(s), and if there is no such material then the primary material may be one of the materials which is used in equal quantity in the active layer(s), the equal quantity being greater than the quantity/ies of the other material(s) used in the active layer(s). Typically although not necessarily, the primary material may be a semiconductor material.

The number and type(s) of layers in a semiconductor device that includes the bulk thinning detector(s) may vary depending on the embodiment. Moreover, the materials used in the layers of the semiconductor device, may vary depending on the embodiment. However, for the sake of further illustration to the reader, some examples are now provided.

For example, a semiconductor device may include one or more active layer(s), also referred to as diffusion layer(s), including one or more electronic components. For instance, electronic component(s) in the active layer(s) may include passive, active and/or electro-mechanic components such as transistors, capacitors, resistors, inductors, diodes, processors, memories, converters, multiplexers, transformers, etc. Typically although not necessarily, electronic component(s) in the active layer(s) may be fabricated by any suitable technique(s) such as doping (e.g. diffusion or ion implantation), etching, deposition and/or patterning of various materials.

A semiconductor device may include, for example, one or more interconnect layer(s). Continuing with the example, a particular interconnect layer may include, for instance, conducting (e.g. metal) material, insulating (e.g. dielectric) material, and/or vertical conductors (e.g. via(s)). For instance, an interconnect layer may be formed by depositing films of metal (e.g. aluminum, copper) which are then patterned and etched to form wires. Dielectric material may then be deposited over the wires, and if there is more than one interconnect layer, the layers may be interconnected by vias. The interconnect layer(s) are conventionally not referred to as active layer(s) since a wire is electrically a single point, with all locations on the wire (ideally) sharing the same voltage level.

A semiconductor device may include, for example, one or more protection layer(s) which may provide protection against scratching, moisture, and/or contamination, etc. Typically although not necessarily, the protection layer(s) may be above the active layer(s), e.g. directly above the interconnect layer(s). For example, the protection layer(s), which in some cases may be passivation layer(s), may be composed of material(s) such as a silicon, silicon nitride, silicon dioxide, aluminum oxide, etc., which may provide such protection against scratching, moisture, contamination, etc. In other examples, the semiconductor device may not include such protection layer(s).

The terms "connect", "disconnect", "reconnect", and variants thereof should be understood to refer to an electrical connection, unless incorrect in a particular context.

Usage of the terms "normally", "typically although not necessarily", "typically", "conventionally", "although not necessarily so", "such as", "e.g.", "possibly", "perhaps", "it may be possible", "optionally", "say", "one embodiment", "embodiments", "an embodiment", "some embodiments", "certain embodiments", "example embodiments", "various embodiments", "other embodiments", "some other embodiments", "another embodiment", "for example" "one example", "an example" "some examples", "examples", "another example", "various examples", "other examples", "for instance", "an instance", "one instance", "some instances", "another instance", "other instances", "various instances" "one case", "cases", "some cases", "another case", "other cases", "various cases", or variants thereof should be construed as meaning that a particular described feature is included in at least one non-limiting embodiment of the subject matter, but not necessarily in all embodiments. The appearance of the same term does not necessarily refer to the same embodiment(s).

Usage of conditional language, such as "may", "can", "could", or variants thereof should be construed as conveying that one or more embodiments of the subject matter may include, while one or more other embodiments of the subject matter may not necessarily include, a particular described feature. Thus such conditional language is not generally intended to imply that a particular described feature is necessarily included in all embodiments of the subject matter. Non-usage of conditional language does not necessarily imply that a particular described feature is necessarily included in all embodiments of the subject matter.

It will be appreciated that various features of the disclosure which are, for clarity, described in the contexts of separate embodiments may also be provided in combination in a single embodiment. Conversely, various features of the disclosure which are, for brevity, described in the context of a single embodiment may also be provided separately or in any suitable sub-combination. It will be appreciated by persons skilled in the art that the present disclosure is not limited by what has been particularly shown and described hereinabove. Rather the scope of the disclosure is defined by the appended claims and equivalents thereof.

What is claimed is:

1. A semiconductor device, comprising:
   a bulk, the bulk comprising a bulk material characterized by a potential designated as a ground for the semiconductor device, the bulk further comprising a bulk thinning detector being a section of the bulk that includes one or more electrical conducting materials, wherein the bulk thinning detector is adapted to be connected to the ground when a part of the bulk material is underneath and contiguous with a portion of the one or more electrical conducting materials in the section; and
   one more electronic components in at least one active layer of the semiconductor device, the one or more electronic components and the bulk thinning detector being included in a circuit for detecting whether there is backside thinning of the semiconductor device, the circuit being adapted to detect whether there is backside thinning by detecting whether at least one of: the bulk thinning detector is disconnected from the ground, or there is a change in resistance of the bulk thinning detector.

2. The semiconductor device of claim 1, wherein the bulk thinning detector is adapted to be disconnected from the ground by backside thinning of the semiconductor device, which thinning removes the part of the bulk underneath and contiguous with the portion of the one or more electrical conducting materials in the section.

3. The semiconductor device of claim 1, wherein the bulk thinning detector is adapted to have resistance thereof lowered by backside thinning of the semiconductor device, which thinning removes at least some of the included one or more electrical conducting materials.

4. The semiconductor device of claim 1 adapted, upon the circuit detecting that there is backside thinning of the semiconductor device, to perform at least one action.

5. The semiconductor device of claim 4, wherein the at least one action is selected from a group comprising: issuing an alert, self-destructing, erasing embedded keys, erasing other content in memory, configuring lower privileges to prevent communications, denying some services, or generating "garbage" data on a bus of a system that includes the semiconductor device.

6. The semiconductor device of claim 4, wherein the at least one action is dependent on at least one of: amount of backside thinning, or location of backside thinning.

7. The semiconductor device of claim 1, wherein the bulk thinning detector is located near a corner of the bulk.

8. The semiconductor device of claim 1, wherein the bulk thinning detector is located sufficiently close to an area in the bulk, such that upon local trenching around the area, the part of the bulk that is underneath and contiguous with the portion of the one or more electrical conducting materials in the section is removed, the area being under one or more blocks in at least one of the at least one active layer.

9. The semiconductor device of claim 1, further comprising one or more other bulk thinning detectors corresponding to respective sections of the bulk, the one or more other bulk thinning detectors also being included in the circuit, wherein the circuit is further adapted to detect at least one of: location of backside thinning or amount of backside thinning, by detecting which, if any, of the bulk thinning detector and the one or more other bulk thinning detectors is at least one of: disconnected from the ground or has a changed resistance.

10. The semiconductor device of claim 9, wherein a respective section of the bulk corresponding to each of the one or more other bulk thinning detectors has a respective depth or respective range of depths, not necessarily identical to a depth or range of depths of the section.

11. The semiconductor device of claim 9, wherein the bulk thinning detector and the one or more other bulk thinning detectors include bulk thinning detectors near the corners of the bulk, and bulk thinning detectors close to at least one area in the bulk.

12. The semiconductor device of claim 1, further comprising one or more other bulk thinning detectors corresponding to respective sections of the bulk, the one or more other bulk thinning detectors being included in another circuit for detecting whether there is backside thinning of the semiconductor device, the other circuit being adapted to detect whether there is backside thinning by detecting whether at least one of the one or more other bulk thinning detectors is at least one of: disconnected from the ground, or has a changed resistance.

13. A method, comprising:
    providing a bulk of a semiconductor device comprising a bulk material characterized by a potential designated as ground for the semiconductor device;
    fabricating a bulk thinning detector that is connected to the ground, including:
        forming a trench from a top of the bulk to a depth or range of depths that is less than a depth of the bulk, by removing a part of the bulk material,
        depositing one or more materials along inner surfaces of the trench,
        removing the deposited one or more materials from a bottom inner surface of the trench, and
        depositing one or more electrical conducting materials in the trench, a portion of the one or more electrical conducting materials being contiguous with a part of the bulk material that is underneath the trench; and
    connecting the bulk thinning detector in a circuit for detecting whether there is backside thinning of the semiconductor device, the circuit being adapted to detect whether there is backside thinning by detecting whether at least one of: the bulk thinning detector is disconnected from the ground, or there is a change in resistance of the bulk thinning detector.

14. The method of claim 13, wherein the one or more materials deposited along the inner surfaces of the trench are characterized by low diffusivity with respect to at least one of: the one or more electrical conducting materials, or the bulk material.

15. The method of claim 13, wherein the bulk thinning detector is connected in the circuit by providing at least one connection between at least some deposited one or more electrical conducting materials and one or more other electronic components in the circuit.

16. The method of claim 13, further comprising: fabricating at least one other bulk thinning detector connected to the ground, including: forming at least one other trench by removing at least one other part of the bulk material, depositing respective one or more materials along inner surfaces of the at least one other trench, removing the respective deposited one or more materials from respective bottom inner surface of the at least one other trench, and depositing respective one or more electrical conducting materials in the at least one other trench.

17. The method of claim 16, wherein said removing at least one other part of the bulk material and said removing the part of the bulk material are performed by first removing an amount of bulk material having a depth equivalent to a difference between a deepest depth and a next deepest depth included among depths or ranges of depths for the trench and the at least one other trench.

18. The method of claim 16, wherein a particular electrical conducting material is used as the respective one or more electrical conducting materials for the at least one other bulk thinning detector and as the one or more electrical conducting materials for the bulk thinning detector.

19. A system comprising:
a semiconductor device comprising:
a bulk, the bulk comprising a bulk material characterized by a potential designated as a ground for the semiconductor device, the bulk further comprising a bulk thinning detector being a section of the bulk that includes one or more electrical conducting materials, wherein the bulk thinning detector is adapted to be connected to the ground when a part of the bulk material is underneath and contiguous with a portion of the one or more electrical conducting materials in the section,
one or more electronic components in at least one active layer of the semiconductor device, the one or more electronic components and the bulk thinning detector being included in a circuit, and
one or more other electronic components for performing at least one function; and
a power source,
wherein the circuit is adapted, when the power source supplies power to the semiconductor device, to operate and detect at least one of: that the bulk thinning detector is connected to the ground, that the bulk thinning detector is disconnected from the ground, that a resistance of the bulk thinning detector is unchanged, or that the resistance of the bulk thinning detector is changed.

20. The system of claim 19, wherein the one or more other electronic components are adapted to perform the at least one function as long as the circuit detects that the bulk thinning detector and any other bulk thinning detector in the circuit, if any, is connected to the ground and has an unchanged resistance.

* * * * *

UNITED STATES PATENT AND TRADEMARK OFFICE
CERTIFICATE OF CORRECTION

PATENT NO. : 9,754,901 B1  
APPLICATION NO. : 15/356691  
DATED : September 5, 2017  
INVENTOR(S) : Elad Peer et al.

Page 1 of 1

It is certified that error appears in the above-identified patent and that said Letters Patent is hereby corrected as shown below:

In the Specification

Column 4, Line 14, "1 micron" to read as --1 $micron^2$--.

Column 20, Line 20, "BTD" to read as --$BTD_1$--.

Signed and Sealed this
Twenty-fourth Day of October, 2017

Joseph Matal
*Performing the Functions and Duties of the*
*Under Secretary of Commerce for Intellectual Property and*
*Director of the United States Patent and Trademark Office*